US009620459B2

(12) United States Patent
Beer et al.

(10) Patent No.: US 9,620,459 B2
(45) Date of Patent: Apr. 11, 2017

(54) SEMICONDUCTOR ARRANGEMENT, METHOD FOR PRODUCING A SEMICONDUCTOR MODULE, METHOD FOR PRODUCING A SEMICONDUCTOR ARRANGEMENT AND METHOD FOR OPERATING A SEMICONDUCTOR ARRANGEMENT

(71) Applicant: Infineon Technologies AG, Neubiberg (DE)

(72) Inventors: Gottfried Beer, Nittendorf (DE); Irmgard Escher-Poeppel, Duggendorf (DE); Juergen Hoegerl, Regensburg (DE); Olaf Hohlfeld, Warstein (DE); Peter Kanschat, Soest (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/476,241

(22) Filed: Sep. 3, 2014

(65) Prior Publication Data
US 2015/0061144 A1 Mar. 5, 2015

(30) Foreign Application Priority Data
Sep. 5, 2013 (DE) .......................... 10 2013 217 802

(51) Int. Cl.
*H01L 21/00* (2006.01)
*H01L 23/00* (2006.01)
(Continued)

(52) U.S. Cl.
CPC ............ *H01L 23/562* (2013.01); *H01L 21/56* (2013.01); *H01L 21/561* (2013.01);
(Continued)

(58) Field of Classification Search
CPC ...................................................... H01L 24/96
See application file for complete search history.

(56) References Cited

U.S. PATENT DOCUMENTS 6,072,240 A 6/2000 Kimura et al.
6,281,569 B1 8/2001 Sugiyama
(Continued)

FOREIGN PATENT DOCUMENTS

CN 1685499 A 10/2005
CN 101075606 A 11/2007
(Continued)

*Primary Examiner* — William Harriston
(74) *Attorney, Agent, or Firm* — Murphy, Bilak & Homiller, PLLC

(57) ABSTRACT

A semiconductor arrangement includes upper and lower contact plates and basic chip assemblies. Each chip assembly has a semiconductor chip having a semiconductor body with upper and lower spaced apart sides. An individual upper main electrode and an individual control electrode are arranged on the upper side. The chip assemblies have either respectively a separate lower main electrode arranged on the lower side of the semiconductor chip of the corresponding basic chip assembly, or a common lower main electrode, which for each of the chip assemblies is arranged on the lower side of the semiconductor body of that chip assembly. An electrical current between the individual upper main electrode and the individual or common lower main electrode is controllable by its control electrode. The chip assemblies are connected to one another with a material bonded connection by a dielectric embedding compound, forming a solid assembly.

21 Claims, 27 Drawing Sheets

(51) Int. Cl.
  *H01L 23/522*  (2006.01)
  *H01L 23/528*  (2006.01)
  *H01L 25/07*  (2006.01)
  *H01L 25/00*  (2006.01)
  *H01L 23/051*  (2006.01)
  *H01L 21/56*  (2006.01)
  H01L 23/31  (2006.01)

(52) U.S. Cl.
  CPC .......... *H01L 21/566* (2013.01); *H01L 21/568* (2013.01); *H01L 23/051* (2013.01); *H01L 23/528* (2013.01); *H01L 23/5226* (2013.01); *H01L 24/24* (2013.01); *H01L 24/33* (2013.01); *H01L 24/72* (2013.01); *H01L 24/82* (2013.01); *H01L 24/90* (2013.01); *H01L 24/96* (2013.01); *H01L 24/97* (2013.01); *H01L 25/072* (2013.01); *H01L 25/50* (2013.01); *H01L 23/3107* (2013.01); *H01L 2224/03002* (2013.01); *H01L 2224/06181* (2013.01); *H01L 2224/24137* (2013.01); *H01L 2224/24195* (2013.01); *H01L 2224/29011* (2013.01); *H01L 2224/33181* (2013.01); *H01L 2224/82039* (2013.01); *H01L 2224/96* (2013.01); *H01L 2924/12042* (2013.01); *H01L 2924/1301* (2013.01); *H01L 2924/1305* (2013.01); *H01L 2924/13055* (2013.01); *H01L 2924/13091* (2013.01); *H01L 2924/19041* (2013.01); *H01L 2924/19042* (2013.01); *H01L 2924/19043* (2013.01); *H01L 2924/19105* (2013.01); *H01L 2924/35* (2013.01)

(56) References Cited

U.S. PATENT DOCUMENTS

2001/0011757 A1    8/2001   Miyake et al.
2005/0161785 A1*   7/2005   Kawashima ...... H01L 23/49562
                                                     257/678

FOREIGN PATENT DOCUMENTS

| CN | 104465566 A | 3/2015 |
| DE | 102012202281 A1 | 8/2013 |
| WO | 2012172991 A1 | 12/2012 |

* cited by examiner

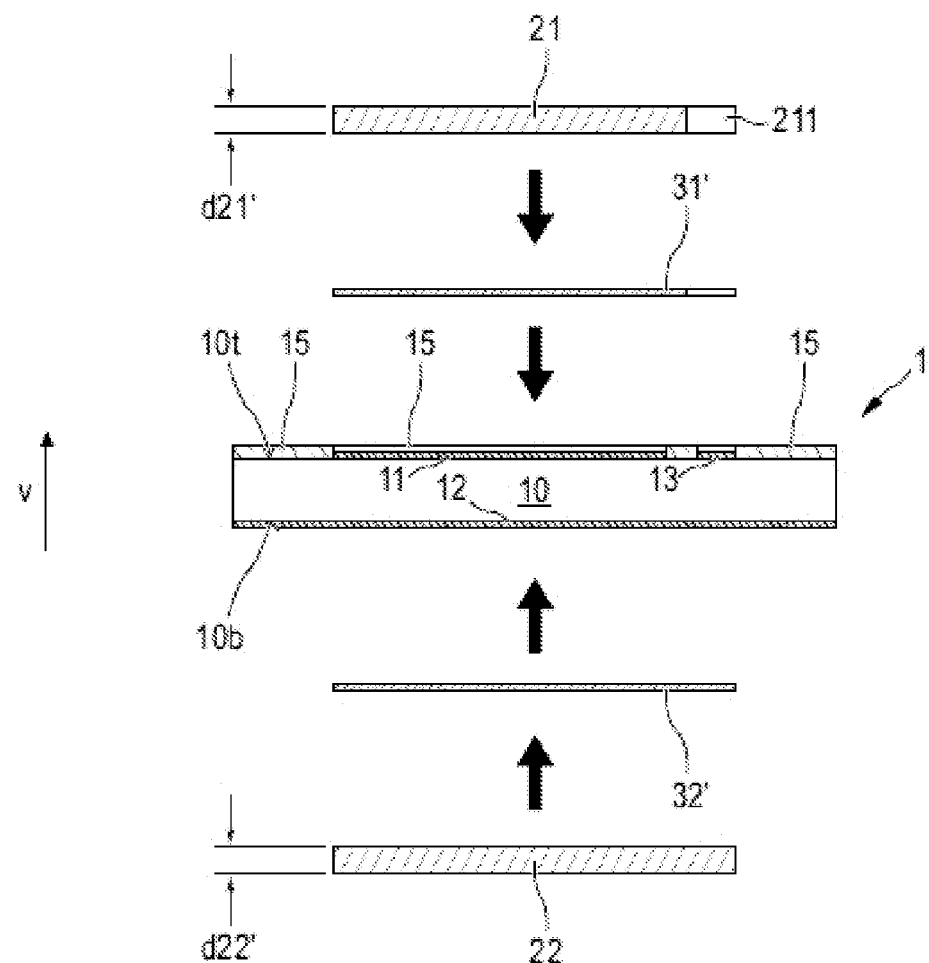
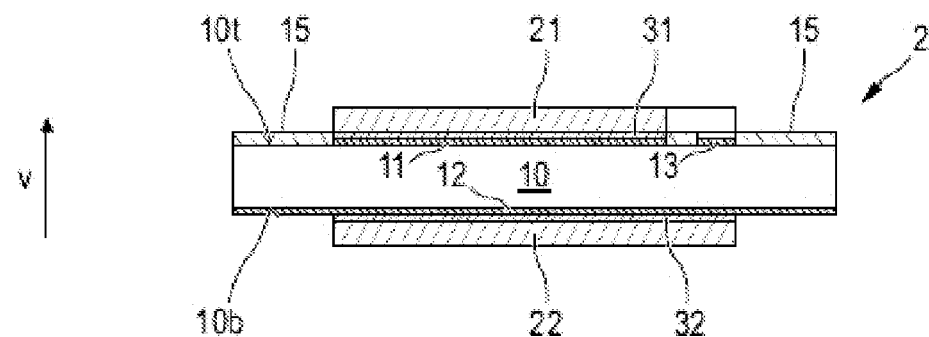

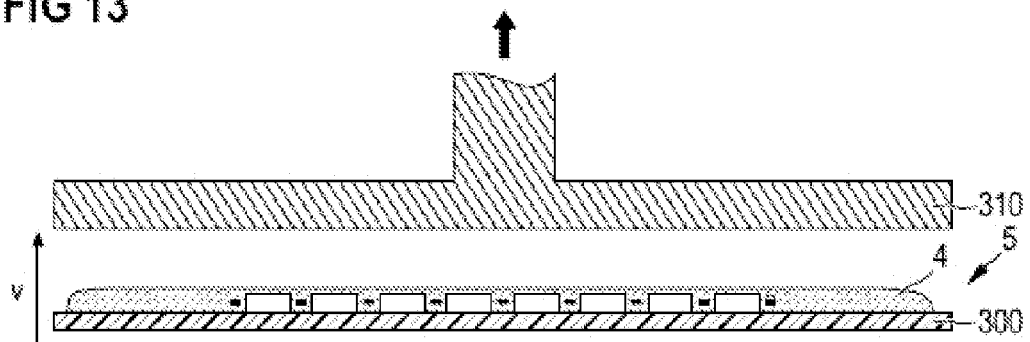
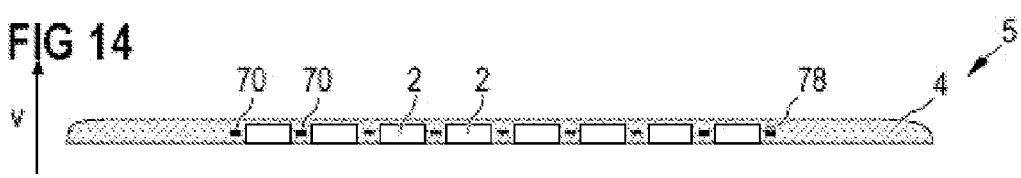
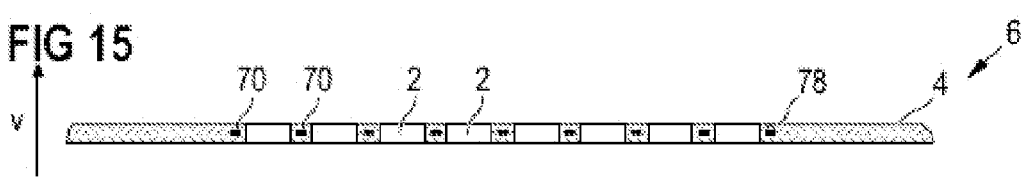
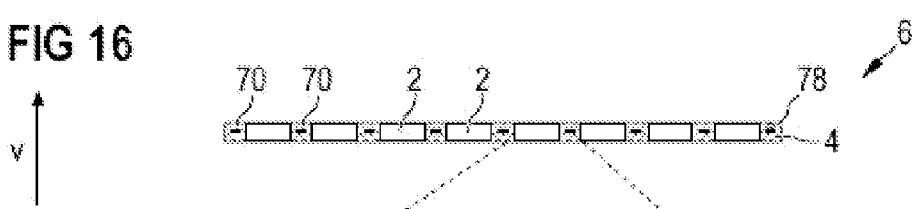
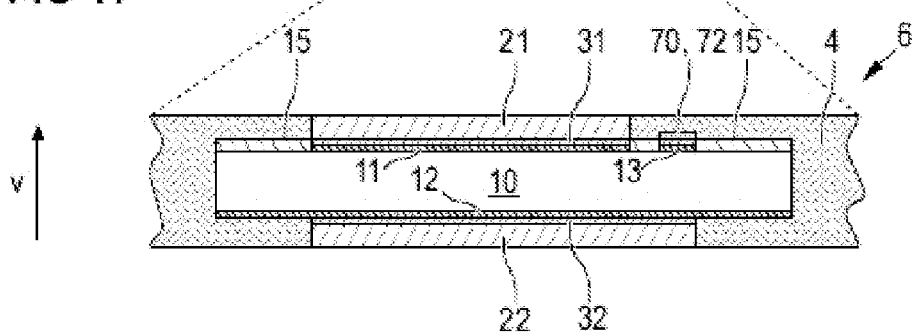

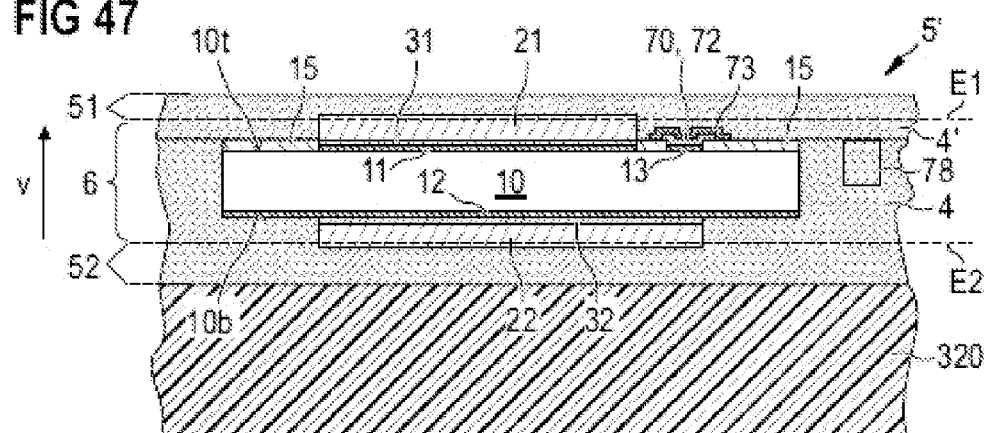
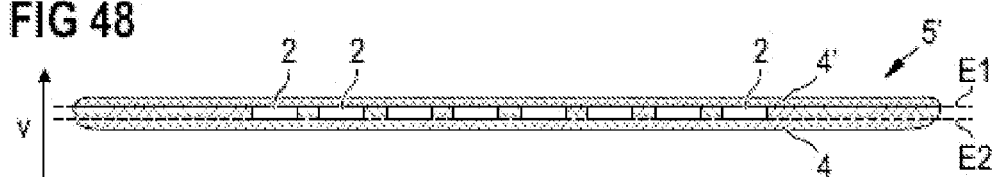
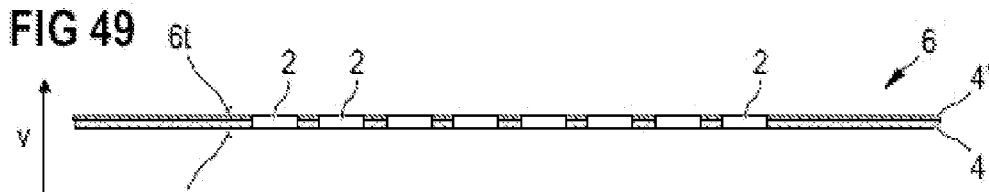
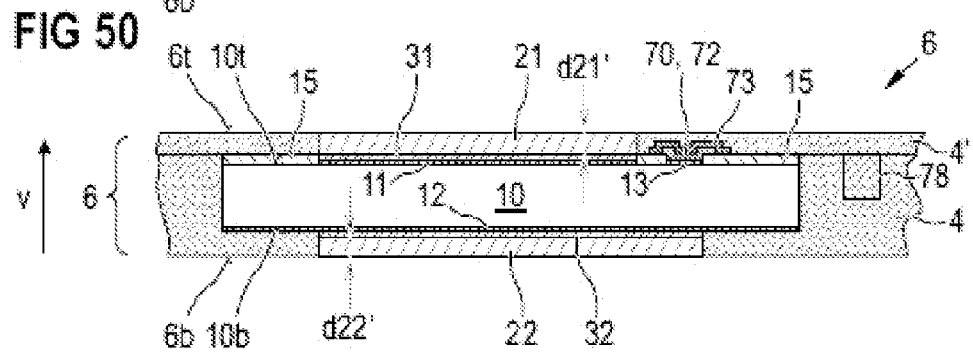
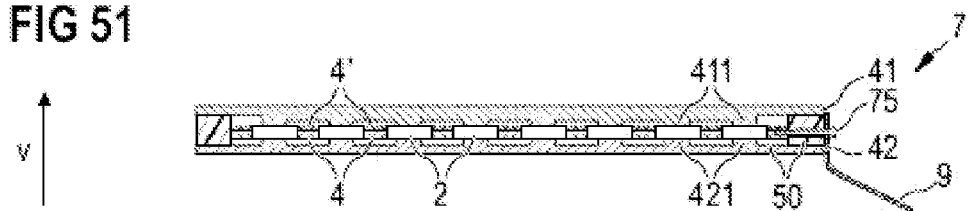

SEMICONDUCTOR ARRANGEMENT, METHOD FOR PRODUCING A SEMICONDUCTOR MODULE, METHOD FOR PRODUCING A SEMICONDUCTOR ARRANGEMENT AND METHOD FOR OPERATING A SEMICONDUCTOR ARRANGEMENT

PRIORITY CLAIM

This application claims priority to German Patent Application No. 10 2013 217 802.6, filed on 5 Sep. 2013, the content of said German application incorporated herein by reference in its entirety.

BACKGROUND

Semiconductor arrangements comprising press pack cells currently available on the market have a complex structure for connecting the semiconductor chips contained in the press pack cells electrically to the main electrodes of the cell, for example the emitter and collector, source and drain or anode and cathode, and/or to the control electrodes, for example the gate or base.

There is therefore a need for an improved design of such semiconductor arrangements, an improved production method and operation of an improved semiconductor arrangement.

SUMMARY

A semiconductor arrangement comprises an upper contact plate and a lower contact plate, as well as a number of basic chip assemblies. Each of the basic chip assemblies has a semiconductor chip having a semiconductor body, which has an upper side and a lower side opposite the upper side, the upper side being separated from the lower side in a vertical direction. Each of the basic chip assemblies furthermore has an individual (i.e. belonging only to the relevant basic chip assembly) upper main electrode arranged on the upper side, and an individual (i.e. belonging only to the relevant basic chip assemblies) control electrode arranged on the upper side. Furthermore, either each of the basic chip assemblies may have an individual (i.e. belonging only to the relevant basic chip assemblies) lower main electrode, which is arranged on the lower side of the semiconductor body of the semiconductor chip of the relevant basic chip assemblies, or the basic chip assemblies may have a common lower main electrode, which is arranged on the lower side of each of the semiconductor bodies of the basic chip assemblies.

With the aid of the control electrode, an electrical current between the individual upper main electrode of this basic chip assembly and the individual lower main electrode of this basic chip assembly, or the common lower main electrode, can be controlled. The current path between the upper main electrode and the lower main electrode will also be referred to below as the "load path".

In this case, main electrodes are intended to mean electrodes between which a load current flows through the semiconductor body during operation of the semiconductor chip. The semiconductor chip may for example contain a diode or a MOSFET, an IGBT, in general an IGFET, a bipolar transistor, a thyristor, or any other controllable power semiconductor component. The upper and lower main electrodes may generally be an anode and a cathode, a cathode and an anode, a drain and a source, a source and a drain, an emitter and a collector, or a collector and an emitter, of any power semiconductor component integrated into the respective semiconductor chip. The control electrode, for example a gate terminal (for example of an MOSFET, IGBT, IGFET or thyristor) or a base terminal (for example of a bipolar transistor, with the exception of an IGBT) constitutes a control terminal by which a load current between the respective upper main electrode and the lower main electrode can be controlled. For each of the basic chip assemblies, the control electrode is located on the upper side of the semiconductor body.

The semiconductor arrangement furthermore comprises a dielectric embedding compound, by which the basic chip assemblies are connected to one another with a material bonded connection in order to form a solid assembly. A control electrode interconnection structure, which is embedded in the solid assembly, connects the control electrodes of the basic chip assemblies to one another. To this end, the dielectric embedding compound may extend continuously between neighboring basic chip assemblies. Optionally, the dielectric embedding compound may even extend continuously between the semiconductor bodies of neighboring basic chip assemblies and respectively directly adjoin these semiconductor bodies, i.e. their semiconductor material.

In a method for producing a semiconductor module, a carrier is provided, as well as a dielectric embedding compound and a number of basic chip assemblies. Each of these basic chip assemblies has a semiconductor chip having a semiconductor body, the semiconductor body having an upper side and a lower side opposite the upper side, and the upper side being separated from the lower side in a vertical direction. Each of the basic chip assemblies furthermore comprises an individual upper main electrode arranged on the upper side and an individual control electrode arranged on the upper side. The basic chip assemblies are arranged next to one another on the carrier. The control electrodes are then electrically conductively connected to one another by means of a control electrode interconnection structure. The basic chip assemblies arranged on the carrier and the control electrode interconnection structure electrically connecting the control electrodes are embedded into the embedding compound. The embedding compound is subsequently cured so that the basic chip assemblies with one another, and the control electrode interconnection structure with the basic chip assemblies, are firmly connected to one another by the embedding compound and the basic chip assemblies together with the control electrode interconnection structure and the embedding compound form a solid assembly. Furthermore, either each of the basic chip assemblies provided has an individual lower main electrode, which is arranged on the lower side of the semiconductor body of the relevant basic chip assembly, or a lower main electrode, which is common to the basic chip assemblies and for each of the basic chip assemblies is arranged on the lower side of the semiconductor body of this chip module. For each of the basic chip assemblies, an electrical current between the individual upper main electrode of the same chip module and the individual or common lower main electrode can be controlled by means of its control electrode.

Starting from a semiconductor module, which may have been produced as explained above, a semiconductor arrangement having the features mentioned above can be produced. To this end, an upper contact plate and a lower contact plate are provided, and the semiconductor module is arranged between the upper contact plate and the lower contact plate in such a way that, for each of the basic chip assemblies, the upper main electrode is electrically conductively connected to the upper contact plate and the lower main electrode is electrically conductively connected to the lower contact plate.

In order to permit electrical operation of a semiconductor arrangement, which is constructed and/or has been produced as explained above, it may be clamped between an electrically conductive upper pressure contact piece and an electrically conductive lower pressure contact piece, in such a way that there is a pressure contact between the upper pressure contact piece and the upper contact plate, without the upper pressure contact piece and the upper contact plate being connected with a material bonded connection, and there is a pressure contact between the lower pressure contact piece and the lower contact plate, without the lower pressure contact piece and the lower contact plate being connected with a material bonded connection. The upper pressure contact piece and the lower pressure contact piece are connected to an electrical voltage source, so that different electrical potentials are applied to the upper pressure contact piece and the lower pressure contact piece.

BRIEF DESCRIPTION OF THE DRAWINGS

The invention will be explained below with the aid of exemplary embodiments with reference to the appended figures. In the figures, the same references refer to parts which are identical or have the same effect.

FIGS. 1 to 29 show the production of a semiconductor arrangement and of a semiconductor module according to a first exemplary embodiment.

FIGS. 30 to 51 show the production of a semiconductor arrangement and of a semiconductor module according to a second exemplary embodiment.

DETAILED DESCRIPTION

Figure 3:
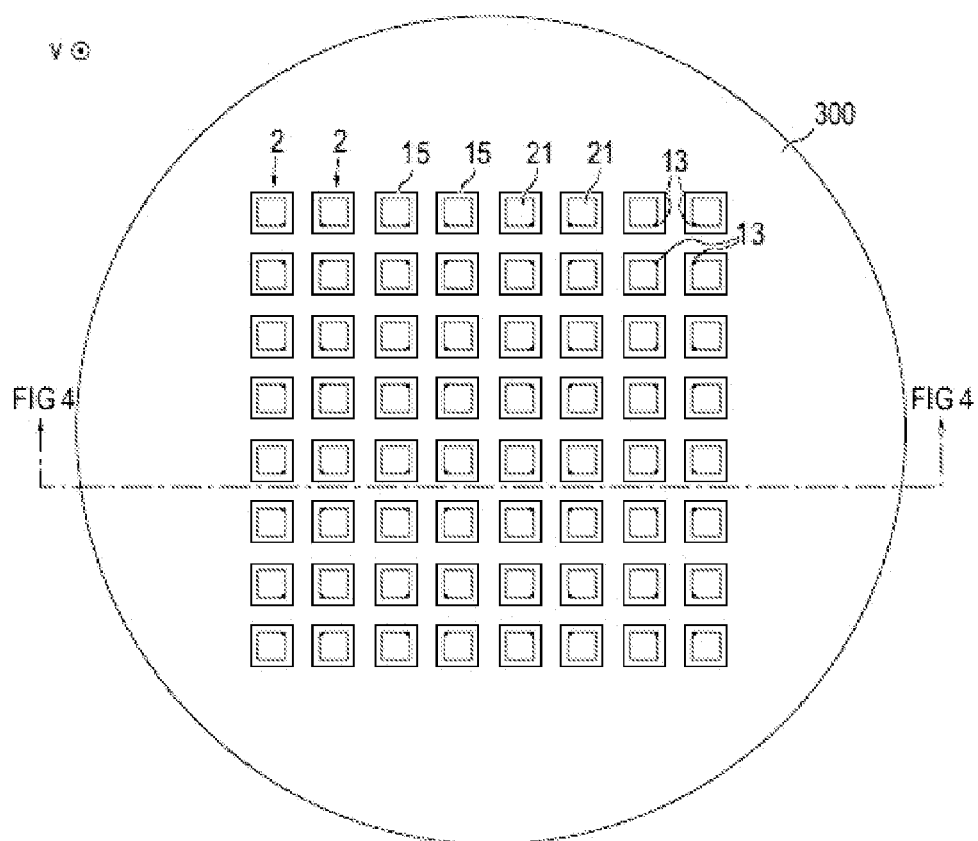

A first exemplary embodiment of a semiconductor arrangement, and a method for its production, will first be explained with the aid of FIGS. 1 to 29.

FIG. 1 shows a semiconductor chip 1 as well as further components for the production of a basic chip assembly 2 as represented in FIG. 2. The semiconductor chip 1 comprises a semiconductor body 10 made of a semiconductor base material, which, in order to produce a power semiconductor component integrated into the semiconductor body 10, contains in particular p-conductive and n-conductive semiconductor zones. Furthermore, the semiconductor chip 1 may also contain any desired number of electrically conductive layers, for example for metallizations, silicide layers or layers of doped polycrystalline semiconductor material (for example polycrystalline silicon), as well as any desired number of dielectric layers, for example nitride layers (for example silicon nitride) or oxide layers (for example silicon oxide) or passivation layers, for example imide layers. The semiconductor base material may be any conventional semiconductor base material known for the production of semiconductor components, for example any desired elemental semiconductors (for example silicon, germanium), any desired compound semiconductors (for example II-VI semiconductors such as zinc selenide or cadmium sulfide, III-V semiconductors such as gallium phosphide, gallium arsenide, indium phosphide, indium antimonide, or IV-IV semiconductors such as silicon carbide or silicon-germanium).

The semiconductor body 10 has an upper side 10$t$ as well as a lower side 10$b$ opposite the upper side. The upper side 10$t$ is separated from the lower side 10$b$ in a vertical direction v, the vertical direction v extending perpendicularly to the lower side 10$b$. An upper main electrode 11 is arranged on the upper side 10$t$, and a lower main electrode 12 is arranged on the lower side 10$b$. There is likewise a control electrode 13 on the upper side 10$t$. Furthermore, an optional upper dielectric passivation layer 15 may be applied onto the upper side 10$t$. This passivation layer 15 may, for example, be a polyimide.

The upper main electrode 11, the lower main electrode 12 and the control electrode 13 may, for example, be thin metallization layers. Such metallization layers may already be applied onto the semiconductor body 10 during the production of the semiconductor chip 1 at the wafer level with further identical semiconductor chips 1, i.e. before the wafer is divided into mutually independent semiconductor chips 1.

As represented in FIG. 2, on the side of the upper main electrode 11 facing away from the semiconductor body 10 there is an electrically conductive upper compensating die 21, which is connected with a material bonded connection to the upper main electrode 11 by means of an upper connecting layer 31. Correspondingly, on the side of the lower main electrode 12 facing away from the semiconductor body 10 there is an electrically conductive lower compensating die 22, which is connected with a material bonded connection to the lower main electrode 12 by means of a lower connecting layer 32.

The compensating dies 21 and 22 are used, in particular, to relieve mechanical stresses which occur when such compensating dies 21, 22 are pressure-contacted by a contact plate 41 or 42 explained below (for example made of copper or aluminum), which has a thermal expansion coefficient very different to the thermal expansion coefficient of the semiconductor body 10. In the absence of compensating dies 21, 22, the contact plate 41 or 42 would directly contact the very thin main electrode 11 or 12, respectively. Owing to the thermomechanical stresses resulting therefrom, in the best case the electrical properties of the semiconductor chip 1 would be modified, and in the least favorable case the semiconductor chip 1 may even tear.

The compensating dies 21 and 22 have (before mounting on the upper main electrode 11 or the lower main electrode 12, and immediately after mounting) relatively large thicknesses d21' and d22' in the vertical direction v, for example at least 0.5 mm each, at least 1 mm each or at least 1.5 mm each. The large thicknesses are furthermore intended to avoid damage to the main electrodes 11 and 12 when the compensating plates 21 and 22 are ground, as will be explained below.

Optionally, the upper compensating die 21 and/or the lower compensating die 22 may have a linear thermal expansion coefficient which is significantly less than the linear thermal expansion coefficient of the upper main electrode 11 and of the lower main electrode 12, in order to achieve adaptation of the linear thermal expansion coefficient to the low linear thermal expansion coefficient of the semiconductor body 10. For example, the upper compensating die 21 and/or the lower compensating die 22 may have a linear thermal expansion coefficient of less than 11 ppm/K, or even less than 7 ppm/K, at a temperature of 20° C. The upper compensating die 21 and/or the lower compensating die 22 may in this case, for example, consist of one of the following materials or have one of the following structures: molybdenum; a metal matrix composite material (MMC), for example AlSiC (aluminum silicon carbide); a multilayer material having two or more metal layers, for example a three-layer material having the layer sequence copper-molybdenum-copper (Cu—Mo—Cu), for example with layer thicknesses in the ratio 1:4:1, which gives an expansion coefficient of the Cu—Mo—Cu three-layer material of about 7.3 ppm/K at a temperature of 20° C.

The upper connecting layer 31 may, for example, be formed as any desired solder layer, and in particular as a diffusion solder layer, as a sintered layer, which contains a sintered metal powder (for example silver powder or silver flakes), or an electrically conductive adhesive layer. Independently thereof, the lower connecting layer 32 may also be formed as any desired solder layer, and in particular as a diffusion solder layer, as a sintered layer, which contains a sintered metal powder (for example silver powder or silver flakes), or an electrically conductive adhesive layer. The upper connecting layer 31 and the lower connecting layer 32 may in particular consist of the same material, although any desired combinations of the materials mentioned for the two layers may also be used.

In FIG. 1, the starting materials which are used for the production of the upper connecting layer 31 and of the lower connecting layer 32 are respectively denoted by 31' and 32'. This is intended to mean that the original connecting means 31' and 32' may be in a modified form after connection is established.

In the case of a starting material 31', 32' formed as a solder (for example a solder containing tin), the resulting connecting layer 31 or 32 may contain a material (for example copper) which is diffused out of the upper main electrode 11, or the lower main electrode 12, into the solder during the connecting process, and therefore constitutes part of the final connecting layer 31 or 32. In order to establish the connections, the solder 31', 32' may, for example, be applied onto the main electrodes 11, 12 and/or onto the compensating dies in the form of a solder paste (for example by screen or template printing). Likewise, however, a solder 31', 32' may also be inserted in the form of a prefabricated solder platelet ("preform solder") between the upper compensating die 21 and the upper main electrode 11, or between the lower compensating die 22 and the lower main electrode 12. In each case, in order to establish the aforementioned connections, the solder paste or the solder platelet/platelets are melted and subsequently cooled, so that a material-bonded connection is respectively formed between the upper compensating die 21 and the upper main electrode 11, or between the lower compensating die 22 and the lower main electrode 12, in the form of the upper connecting layer 31 or the lower connecting layer 32.

In the case of a connecting layer 31 or 32 formed as a sintered layer, the starting material 31' or 32' on which it is based may be formed as a paste, which contains a metal powder (for example silver powder or silver flakes), as well as a solvent. In order to produce the connecting layers 31, 32, the paste may for example be applied onto the main electrodes 11, 12 and/or onto the compensating dies 21, 22 (for example by screen or template printing). A paste layer formed from the paste is then arranged between the upper main electrode 11 and the upper compensating die 21 and respectively contacts them, and/or a further paste layer formed from the paste is arranged between the lower main electrode 12 and the lower compensating die 22 and respectively contacts them. In this state, the paste layer or layers are dried by evaporation of the solvent contained therein and then sintered, in which case the sintering may take place at temperatures significantly below 250° C. As a result of the sintering, the (electrically conductive) upper connecting layer 31 or the (electrically conductive) lower connecting layer 32 is formed from the two paste layers 31', 32'.

In the case of a connecting layer 31 or 32 formed as an electrically conductive adhesive layer, the starting material 31' or 32' on which it is based is formed as an electrically conductive adhesive. In order to produce the connecting layers 31, 32, the adhesive may for example be applied onto the main electrodes 11, 12 and/or onto the compensating dies 21, 22 (for example by screen or template printing). An upper adhesive layer formed from the adhesive is arranged between the upper main electrode 11 and the upper compensating die 21 and respectively contacts them. As a result of the subsequent curing, the electrically conductive upper connecting layer 31 is formed from the upper adhesive layer. Correspondingly, a lower adhesive layer formed from an adhesive is arranged between the lower main electrode 12 and the lower compensating die 22 and respectively contacts them. As a result of the subsequent curing, the electrically conductive lower connecting layer 32 is formed from the lower adhesive layer.

Figure 4:
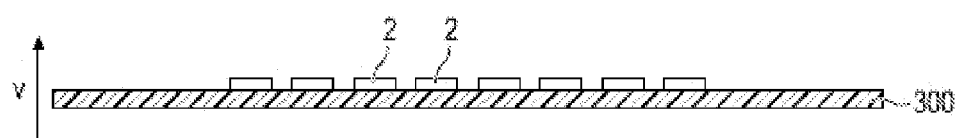

As is furthermore shown in FIG. 3 and in FIG. 4 in vertical section, a plurality of basic chip assemblies 2, each of which has a semiconductor chip 1 and as explained is fitted with an upper compensating die 21 and a lower compensating die 22, are then placed next to one another on the same side of a common carrier 300. Optionally, the placement—as shown—may be carried out in such a way that, for all the basic chip assemblies 2, the upper compensating dies 21 face away from the carrier 300. In principle, however, in the case of one or more of the basic chip assemblies 2 the upper compensating dies 21 may also face away from the carrier 300, while in the case of one or more other of the basic chip assemblies 2 the upper compensating dies 21 face toward the carrier 300.

The placement of the basic chip assemblies 2 on the carrier 300 may be carried out in such a way that they are in predetermined positions relative to one another. In order to avoid slipping of the placed basic chip assemblies 2, the surface of the carrier 300 may be formed in such a way that the basic chip assemblies 2 adhere thereon. To this end, for example, the carrier 300 may be provided with an adhesive film on which the basic chip assemblies 2 are placed.

Figure 5:
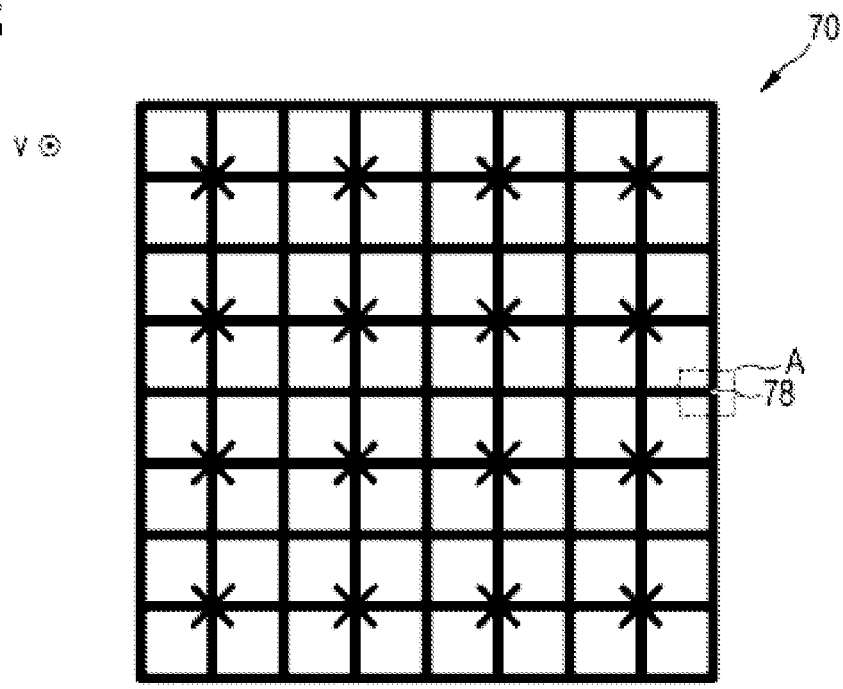
Figure 6:
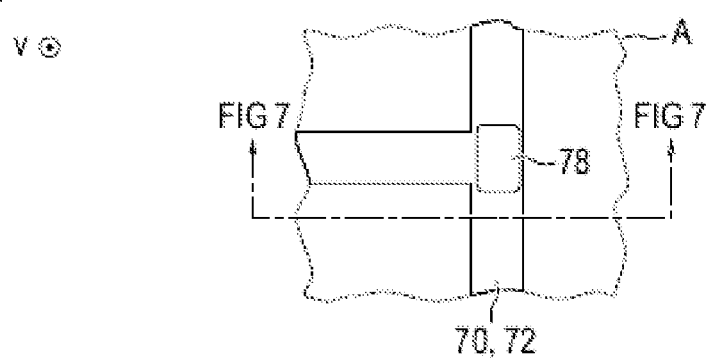
Figure 7:
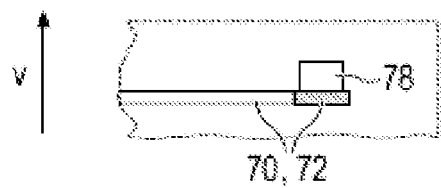

As is furthermore shown in FIG. 5, after the placement of the basic chip assemblies 2 on the carrier 300, a control electrode interconnection structure 70 is provided, onto which the basic chip assemblies 2 fixed on the carrier 300 are applied in such a way that the control electrodes 13 of the basic chip assemblies 2 are electrically conductively connected to one another by the control electrode interconnection structure 70. The control electrode interconnection structure 70 may for example be formed as a prefabricated printed circuit board in the form of a grid, or as a prefabricated electrically conductive lead frame. In each case, the control electrode interconnection structure 70 has a conductor structure 72, as shown in the enlarged detail A according to FIG. 6 and by the vertical section through the detail A according to FIG. 7. In the case of a printed circuit board, the conductor structure 72 may be formed by surface-wide metallization of a dielectric carrier (for example FR-4). In the case of an electrically conductive lead frame, the conductor structure 72 may, for example, be produced by stamping a metal sheet. The electrically conductive connection between the conductor structure 72 of the control electrodes 13 may be established by means of a connecting layer 33 (see FIG. 10), for example a solder, a layer of a sintered metal powder, an electrically conductive adhesive or a pure pressure contact.

Figure 10:
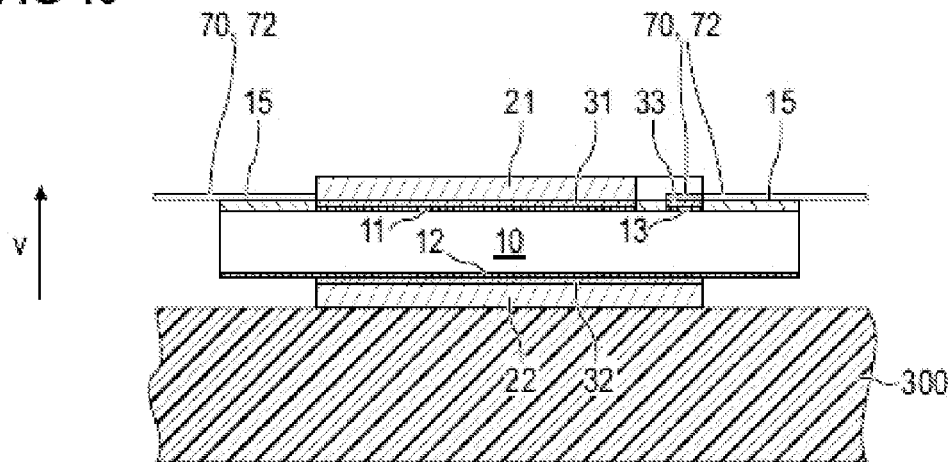

In the arrangement according to FIG. 10, the control electrode interconnection structure 70 bears directly on the passivation layer 15. As an alternative to this, the control electrode interconnection structure 70 and/or the conductor structure 72 of the control electrode interconnection structure 70 may also be separated from the passivation layer 15. The free space then formed between the passivation layer 15 and the control electrode interconnection structure 70, or between the passivation layer 15 and the conductor structure 72, would subsequently be filled with embedding compound 4. In order to ensure the required electrical connection between the control electrode interconnection structure 70, or a conductor structure 72 of the control electrode interconnection structure 70, and the control electrode 13, the connecting layer 33 would need to be made correspondingly thicker, and/or the control electrode interconnection structure 70 or its conductor structure 72 would need to have an extension above the control electrode 13, which extends in the direction of the control electrode 13.

Optionally, before, during or after the connection of the control electrode interconnection structure 70 to the control electrodes 13, an electrically conductive connection piece 78 may be applied onto the control electrode interconnection structure 70 and electrically conductively connected to the conductor structure 72, which may be done by means of a solder, a layer of a sintered metal powder, an electrically conductive adhesive, by welding or by ultrasonic bonding.

Figure 8:
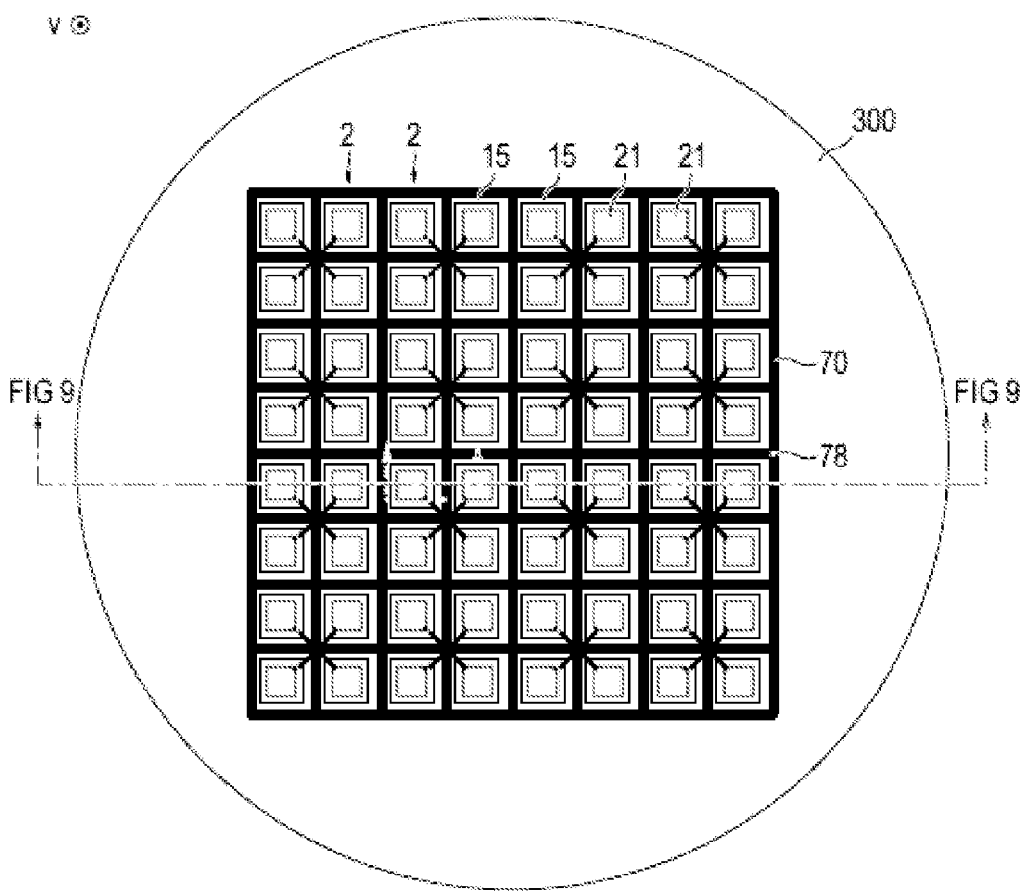
Figure 9:
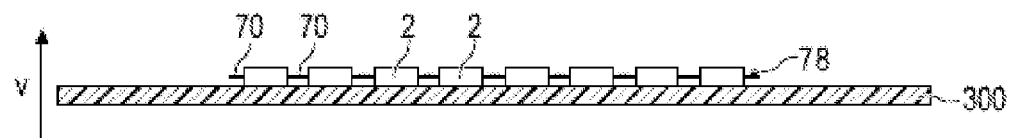

FIGS. 8 and 9 respectively show a plan view and a vertical section corresponding to FIGS. 3 and 4, but after mounting of the control electrode interconnection structure 70 on the control electrodes 13. The representation is merely to be understood as schematic. In particular, FIG. 9 is intended to show that (because of the upper compensating die 21) the basic chip assemblies 2 may extend beyond the control electrode interconnection structure 70 in the vertical direction v. FIG. 10 represents an enlarged detail of the view according to FIG. 9. The connecting layer 33 explained above is also shown therein.

Figure 11:
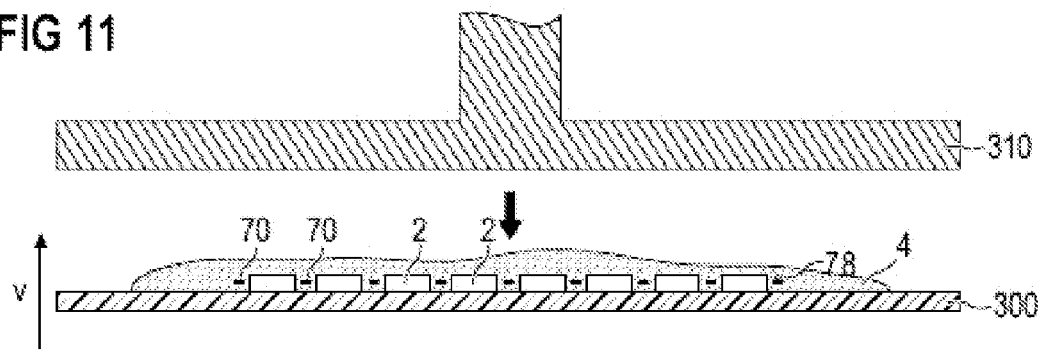
Figure 12:
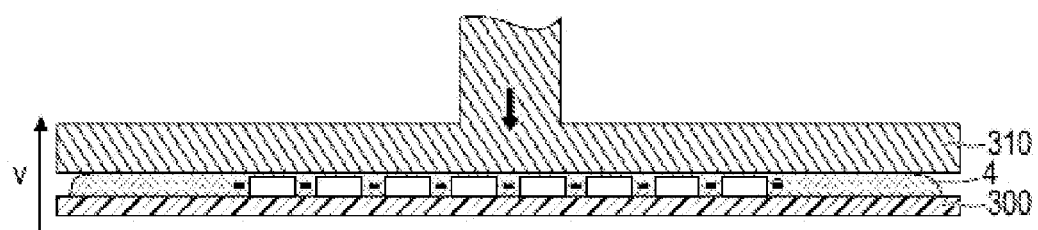

As is furthermore shown by FIG. 11, after establishment of the electrically conductive connection between the control electrode interconnection structure 70 and the control electrodes 13, a viscous embedding compound 4 is applied over the basic chip assemblies 2 located on the carrier 300. The embedding compound 4 is then, as represented in FIG. 12, pressed against the carrier 300 by means of a die 310, in such a way that at least the intermediate spaces lying between respectively neighboring basic chip assemblies 2 are filled with the embedding compound 4.

The embedding compound 4 is then cured, so that the basic chip assemblies 2 embedded in the embedding compound 4 form a solid assembly 5 together with the embedding compound 4. As is furthermore shown in FIG. 13, after the curing of the embedding compound 4, the die 310 may be raised from the solid assembly 5 and the assembly 5 may be removed from the carrier 300. FIG. 14 shows the assembly 5 then obtained. The effect of the embedding compound 4, which is dielectric at least in the cured state, is that the basic chip assemblies 2 are connected to one another firmly and with a material bonded connection. For example, polycondensed polymers (for example an epoxy resin or a polyurethane-based encapsulation material) are suitable as the embedding compound. In principle, however, any desired embedding compound 4 may be used for all configurations of the invention, so long as they are dielectric in the cured state. In particular, according to the present invention an embedding compound may be formed from a homogeneous material or a homogeneous material mixture.

An upper cover layer 51 of the assembly 5 may now be removed from the assembly 5, so that a residual assembly 6 remains of the assembly 5 (see FIG. 15). Optionally, the assembly 5 may be brought into a desired geometrical shape before or after the removal of the cover layer 51, for example by form milling. In this regard, FIG. 16 represents by way of example a residual assembly 6 which has an essentially rectangular base contour, which is shown in plan view according to FIG. 18, in which the upper compensating dies 21 can also be seen. FIG. 17 also shows an enlarged detail of the view according to FIG. 16.

The production will be explained below with reference to the structure according to FIGS. 16 to 18. The further production could, however, also be carried out in the same way starting from the arrangement according to FIG. 15. Possibly desired adaptation to a desired geometrical shape may then be carried out at a later time.

In each case, the effect of the embedding compound 4 is that the basic chip assemblies 2 are firmly connected to one another in a residual assembly 6 as well. In this case, the embedding compound 4 may optionally bear directly on the semiconductor body 10 of each of the basic chip assemblies 2, i.e. on the semiconductor material thereof. The embedding compound 4 may in this case extend continuously between the semiconductor bodies 10 of the semiconductor chips 1 of neighboring basic chip assemblies 2.

Figure 18:
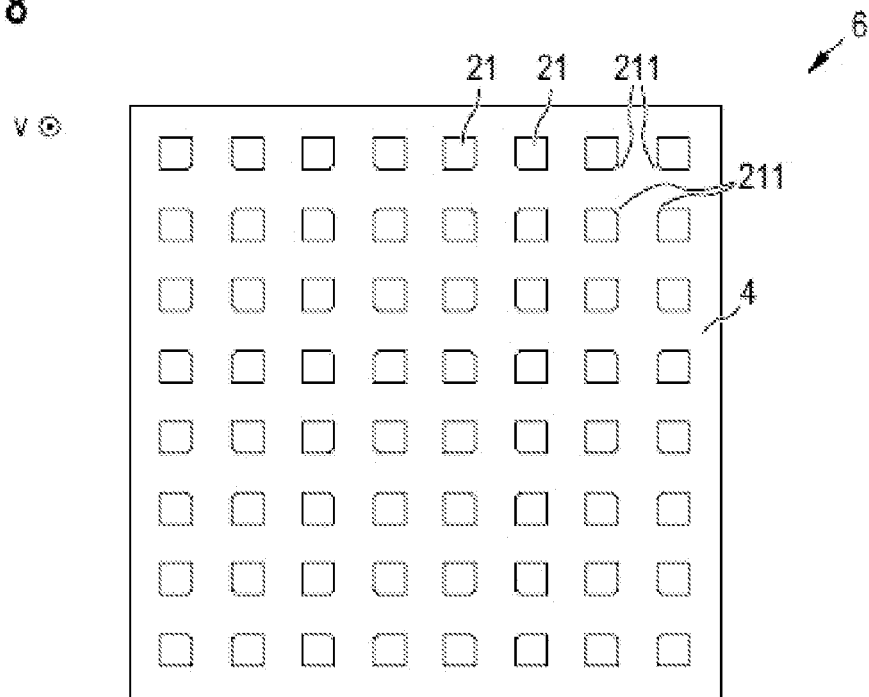
Figure 19:
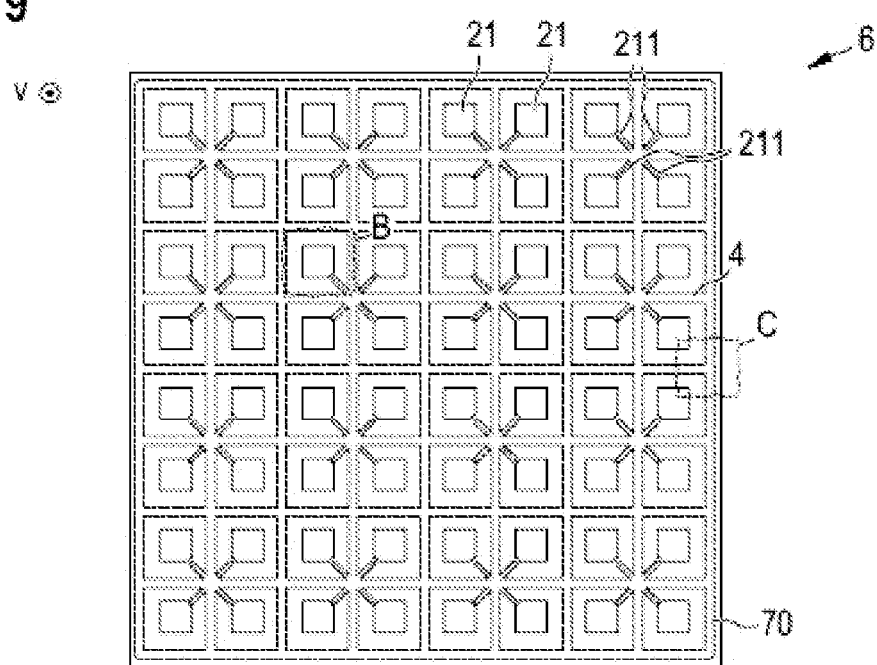
Figure 20:
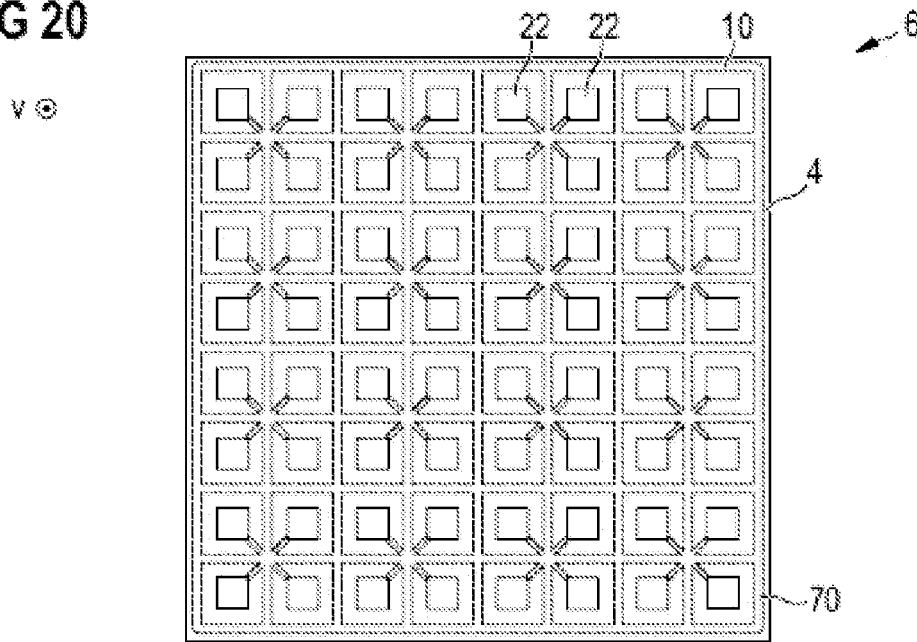

FIG. 19 shows the arrangement according to FIG. 18, as well as the profile of the control electrode interconnection structure 70 covered by the embedding compound 4 and therefore only represented by dashes. The representation according to FIG. 20 corresponds to the representation according to FIG. 19, but with a view of the opposite side, so that the lower compensating dies 22 can be seen in this case. The profile of the control electrode interconnection structure 70 covered by the embedding compound 4 is again represented by dashes.

Figure 21:
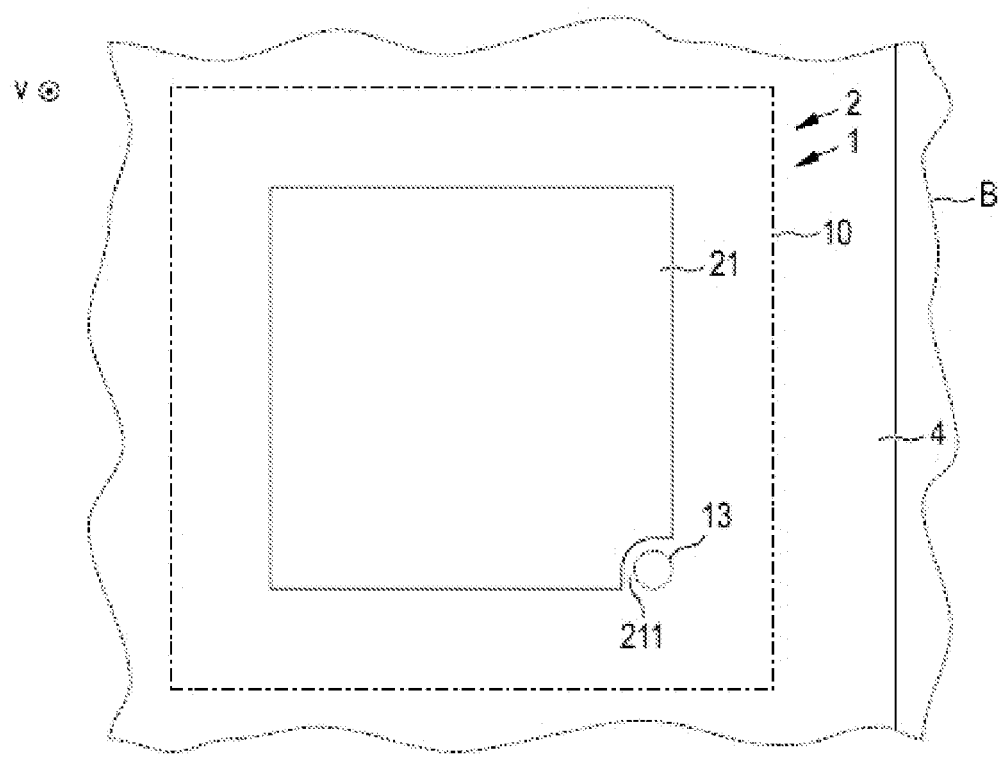

FIG. 21 shows an enlarged detail B, shown in FIG. 19, with a chip module 2. The lateral border of the semiconductor body 10, covered by the embedding compound 4, of the semiconductor chip 1 of the basic chip assembly 2 is represented therein by means of a dot-and-dash line. The lateral border of the control electrode 13, likewise covered by the embedding compound 4, is represented by means of a dotted line. On the other hand, the profile of the control electrode interconnection structure 70 is not represented.

Figure 22:
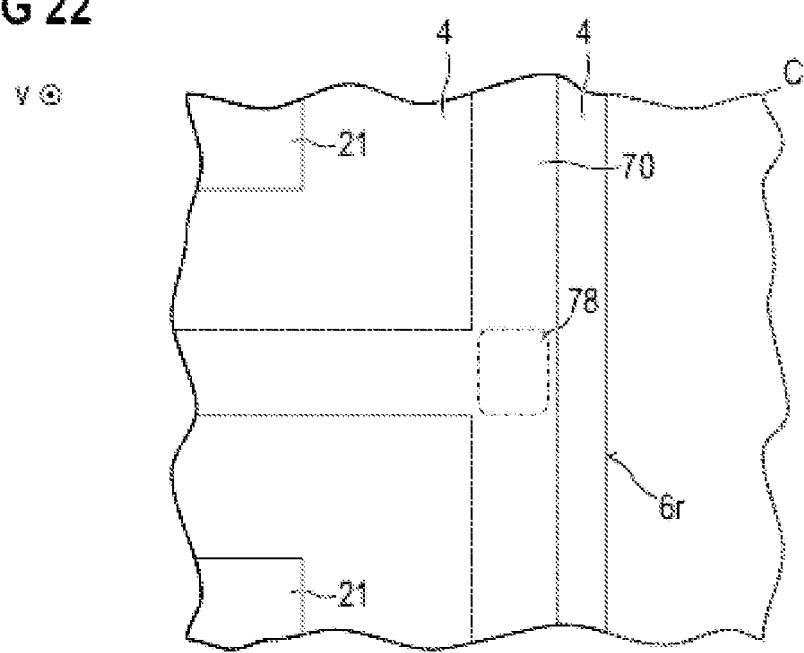

FIG. 22 shows an enlarged detail C, shown in FIG. 19, with a section of the side edge 6r of the residual assembly 6, or of the embedding compound 4. The lateral border of the optional electrically conductive connection piece 78, covered by the embedding compound 4, is represented therein by means of a dot-and-dash line. The profile of the control electrode interconnection structure 70, likewise covered by the embedding compound 4, is represented by means of a dotted line.

Figure 23:
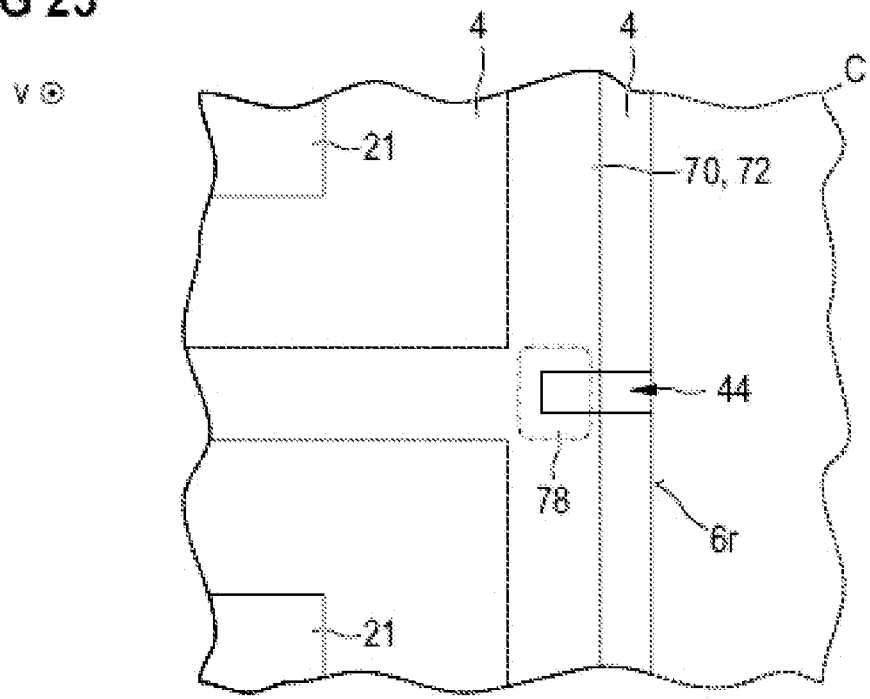
Figure 24:
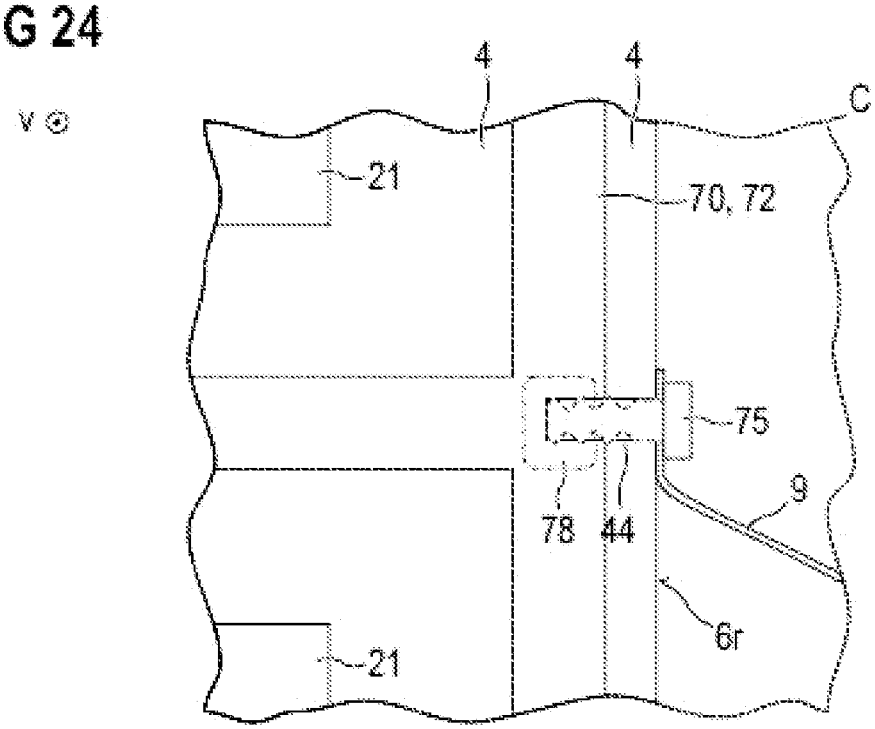

If an electrically conductive connection piece 78 is provided, it may be electrically contacted from outside the residual assembly 6 by a connection electrode 75, which is passed through a feed-through formed in the embedding compound 4, for example as a bore or as a groove. An example of this is shown by FIGS. 23 and 24, which correspond to the detail C according to FIGS. 19 and 22. As initially shown in FIG. 23, the connection piece 78 embedded in the embedding compound 4 may be drilled through the cured embedding compound 4, so that a feed-through 44 formed as a bore is obtained. Likewise, instead of a bore, a groove may be milled into the embedding compound 4, and optionally also into the connection piece 78 embedded therein. In each case, the feed-through 44 may extend starting from the side edge 6r of the residual assembly 6, or of the embedding compound 4, in a direction perpendicular to the vertical direction v into the embedding compound 4, at least as far as the connection piece 78.

As is furthermore shown in FIG. 24, a connection electrode 75 may then be inserted into the feed-through 44, so that it electrically contacts the connection piece 78. The connection electrode 75 may for example be a screw, which is screwed into the bore formed with a reduced dimension relative to the external screw thread of the screw, in such a way that the external screw thread cuts into the connection piece 78. As an alternative, an internal screw thread which matches the external screw thread of the screw, and extends into the connection piece 78, may also be cut first into the bore, and the screw 75 may then be screwed into the internal screw thread as far as the connection piece 78. A further alternative is to insert the soldered tip of a connection electrode 75 into the feed-through 44 and then to solder the connection electrode 75 to the connection piece 78. The heat required for the soldering may be supplied via the connection electrode 75. It is likewise possible to connect the connection electrode 75 mechanically and electrically conductively to the connection piece 78 by means of an electrically conductive adhesive.

As is likewise represented in FIG. 24, the connection electrode 75 may be used in order to fasten a control line 9 to the residual assembly 6. By means of such a control line 9, the control electrodes 13 may be supplied during subsequent operation with an electrical control signal, for example a "high" level or a "low" level, for example in order to set the load path in a conductive or blocking state.

As an alternative to a connection piece 78, which as described is connected electrically conductively and optionally also with a material bonded connection to a conductor structure 72 of the control electrode interconnection structure 70, the conductor structure 72 may also be electrically contacted directly by a connection electrode 75 in a manner described with the aid of FIGS. 23 and 24, and/or electrically connected to a control line 9. In this case, the conductor structure 72 itself fulfills the function of the connection piece 78.

Figure 25:
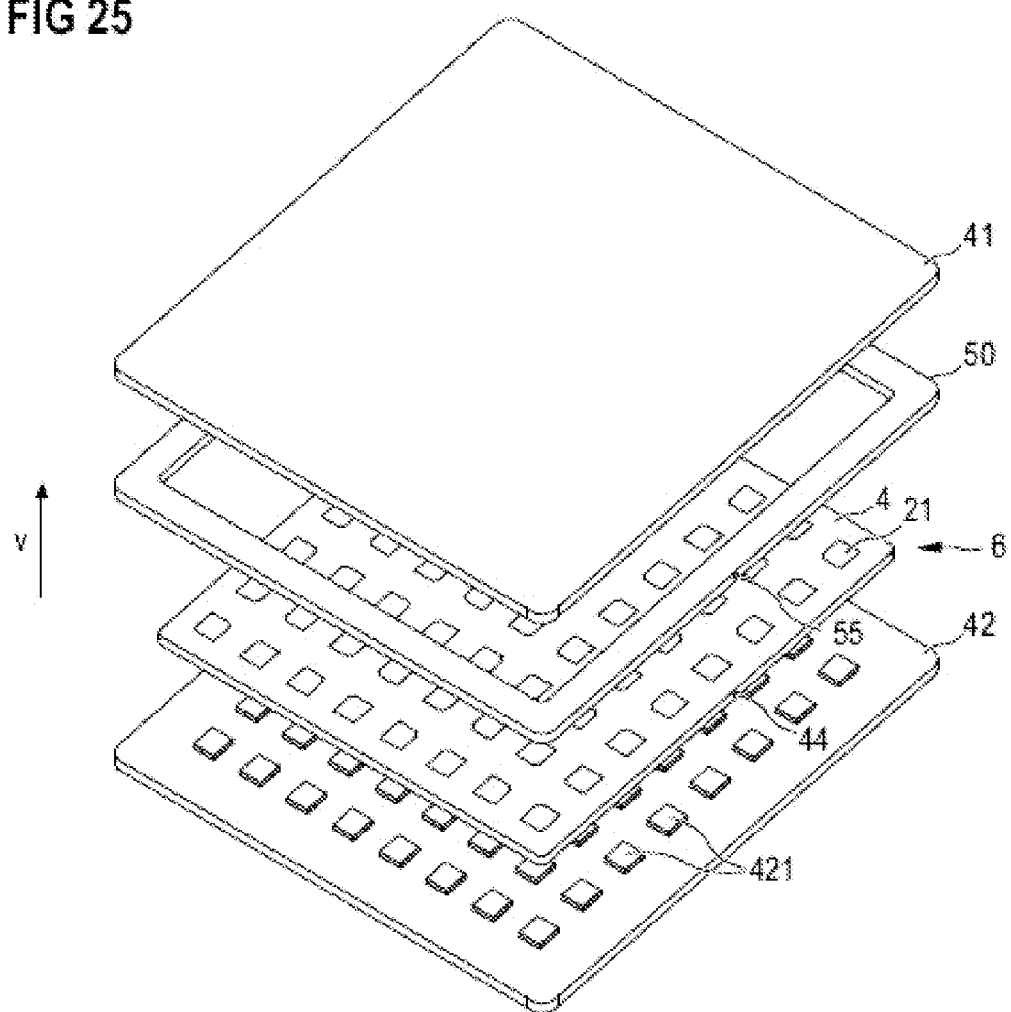
Figure 26:
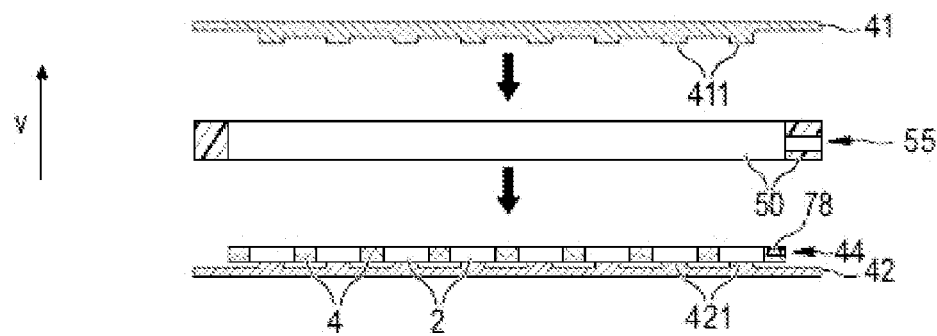
Figure 27:
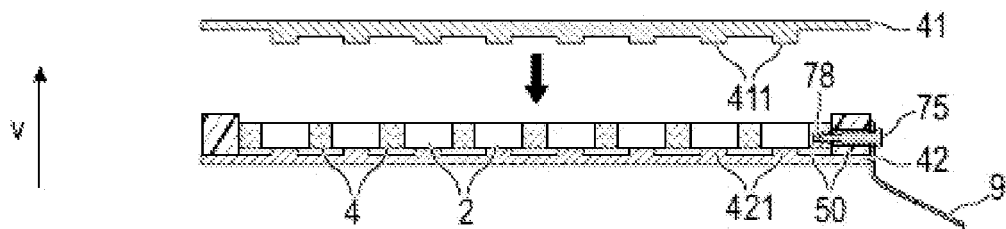
Figure 28:
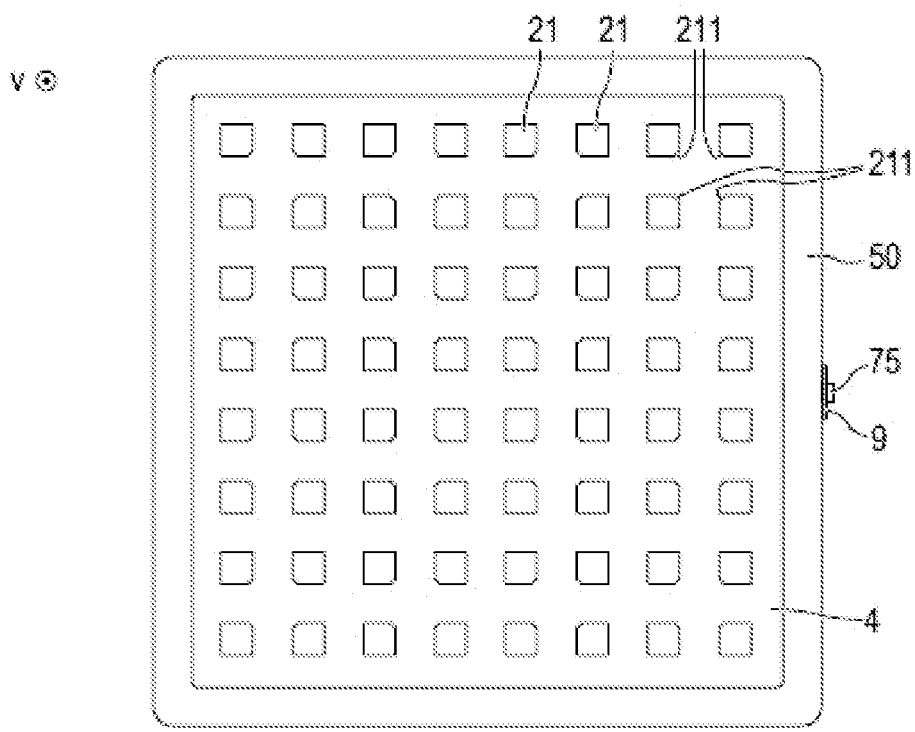
Figure 29:
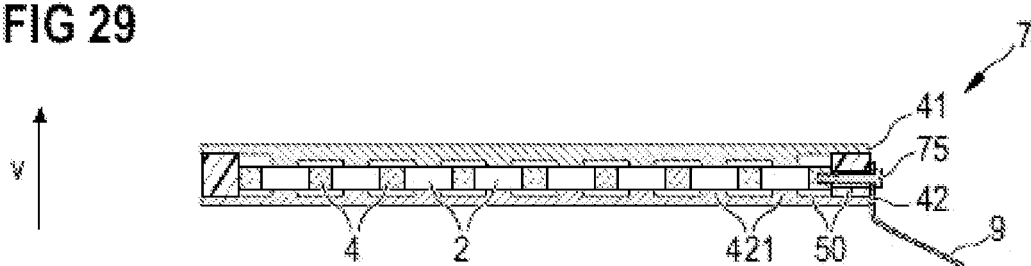

FIG. 25 shows an exploded representation of the finished semiconductor arrangement 7 shown in FIG. 29, FIGS. 26 and 27 show the semiconductor arrangement 7 during its assembly, and FIG. 28 shows a plan view of the arrangement according to FIG. 29, but without the upper contact plate 41. As revealed by these FIGS. 25 to 29, the semiconductor arrangement 7 comprises a residual assembly 6 with a feed-through 44, an electrically conductive upper contact plate 41, an electrically conductive lower contact plate 42, and a spacer ring 50. The residual assembly 6 could be provided with a connection electrode 75 and/or a control line 9, as explained with reference to FIGS. 23 and 24.

The residual assembly 6 with the control electrode interconnection structure 70 embedded in the embedding compound 4 is arranged between the upper contact plate 41 of the lower contact plate 42. The upper contact plate 41 is used to electrically and mechanically contact the compensating die 21, 22 (here the upper compensating die 21), facing toward the upper contact plate 41, of each of the basic chip assemblies 2. To this end, for each of the basic chip assemblies 2, the upper contact piece 41 has an upper contact elevation 411 (see FIG. 26), which electrically and mechanically contacts one of the compensating dies 21, 22 (here the upper compensating die 21) of the relevant chip module 2.

Correspondingly, the lower contact plate 42 is used to electrically and mechanically contact the compensating die 21, 22 (here the lower compensating die 22), facing toward the lower contact plate 42, of each of the basic chip assemblies 2. To this end, for each of the basic chip assemblies 2, the lower contact piece 42 has a lower contact elevation 421, which electrically and mechanically contacts one of the compensating dies 21, 22 (here the lower compensating die 22) of the relevant chip module 2.

Copper for example, which may optionally be provided with a thin nickel layer on the surface, is suitable as material for the upper contact piece 41 and/or the lower contact piece 42. In principle, however, any other desired electrically conductive materials, in particular metals or metal alloys, may be used, for example aluminum or an aluminum alloy or a copper alloy, with or without a coating.

In the example shown, for each of the basic chip assemblies 2 of the semiconductor arrangement 7, the upper contact die 21 lies on the side of the basic chip assembly 2 facing toward the upper contact plate 41, and the lower contact die 22 lies on the side of the basic chip assembly 2 facing toward the lower contact plate 42.

In contrast, other semiconductor arrangements may have a first subset of the basic chip assemblies 2 and a second subset of the basic chip assemblies 2, wherein for each of the basic chip assemblies 2 of the first subset, the upper contact die 21 lies on the side of the basic chip assembly 2 facing toward the upper contact plate 41 and the lower contact die 22 lies on the side of the basic chip assembly 2 facing toward the lower contact plate 42, and wherein for each of the basic chip assemblies 2 of the second subset, the upper contact die 21 lies on the side of the basic chip assembly 2 facing toward the lower contact plate 42 and the lower contact die 22 lies on the side of the basic chip assembly 2 facing toward the upper contact plate 41.

It is likewise possible that, for each of the basic chip assemblies 2 of a semiconductor arrangement, the upper contact die 21 lies on the side of the basic chip assembly 2 facing toward the lower contact plate 42, and the lower contact die 22 lies on the side of the basic chip assembly 2 facing toward the upper contact plate 41.

The spacer ring 50, which is arranged between the contact plates 41 and 42 and annularly surrounds the residual assembly 6, consists of a dielectric material, for example ceramic. In this way, an electrical short circuit between the contact plates 41 and 42 is prevented. As also in all other configurations of the invention, the spacer ring 50 may be connected with a material bonded connection both to the upper contact plate 41 and to the lower contact plate 42, for example by soldering, adhesive bonding or sintering.

As an alternative or in addition to a control electrode interconnection structure 70, which is arranged as explained above between the semiconductor chips 1 of the basic chip assemblies 2 and the upper contact plate 41, the control electrode interconnection structure 70, or a further control electrode interconnection structure, could also be arranged in a corresponding way between the semiconductor chips 1 of the basic chip assemblies 2 and the lower contact plate 42, in order to electrically connect control electrodes 13 which may optionally be arranged on the side of the semiconductor body 10 facing toward the lower contact piece 42.

If there is at least one control electrode interconnection structure 70, for each of the control electrode interconnection structures 70 a connection electrode 75 and/or an electrically conductive control line 9 (see FIGS. 23, 24 and 27 to 29) may be provided in order to be able to electrically contact the relevant control electrode interconnection structure 70 from outside the finished semiconductor arrangement 7 (see FIG. 29). In this case, each such control electrode interconnection structure 70 may, independently of the configuration of another control electrode interconnection structure 70, as explained with the aid of FIGS. 23 and 24, be electrically contacted from outside the residual assembly 6 by an electrically conductive connection piece 78, connected electrically conductively and optionally also with a material bonded connection to a conductor structure 72, or the conductor structure 72 of this control electrode interconnection structure 70 may itself fulfill the function of the connection piece 78.

In each case, a connection electrode 75 or, as represented in FIGS. 27 and 29, a control line 9, may be passed through an axis opening or groove 55 formed in the spacer ring 50 (see FIGS. 25 and 26) as far as the outside of the semiconductor arrangement 7. Inside the spacer ring 50, the control line 9 (and/or the connection electrode 75) is electrically conductively connected to the control electrode interconnection structure 70 and therefore to the control electrodes 13. If a connection electrode 75, for example a screw, is used, this may be passed not only through the feed-through 44 but also through the axis opening or groove 55. In the case of a screw, it may have a screw head which bears on the spacer ring 50 directly or indirectly, for example via a washer, when the screw is screwed into a connection piece 78 or into a conductor structure 72 of the control electrode interconnection structure 70.

A second exemplary embodiment of a semiconductor arrangement, and a method for its production, will subsequently be explained with the aid of FIGS. 30 to 51. While in the first exemplary embodiment the semiconductor chips 1 of the basic chip assemblies 2 were respectively provided with an upper compensating die 21 and a lower compensating die 22 before embedding in the embedding compound 4, in the second exemplary embodiment the semiconductor chips 1 are respectively provided only with one compensating die before the embedding. This compensating die may respectively be the upper compensating die 21, but also the lower compensating die 22. In the following figures, this will be explained with reference to the example of the lower compensating die 22.

Figure 30:
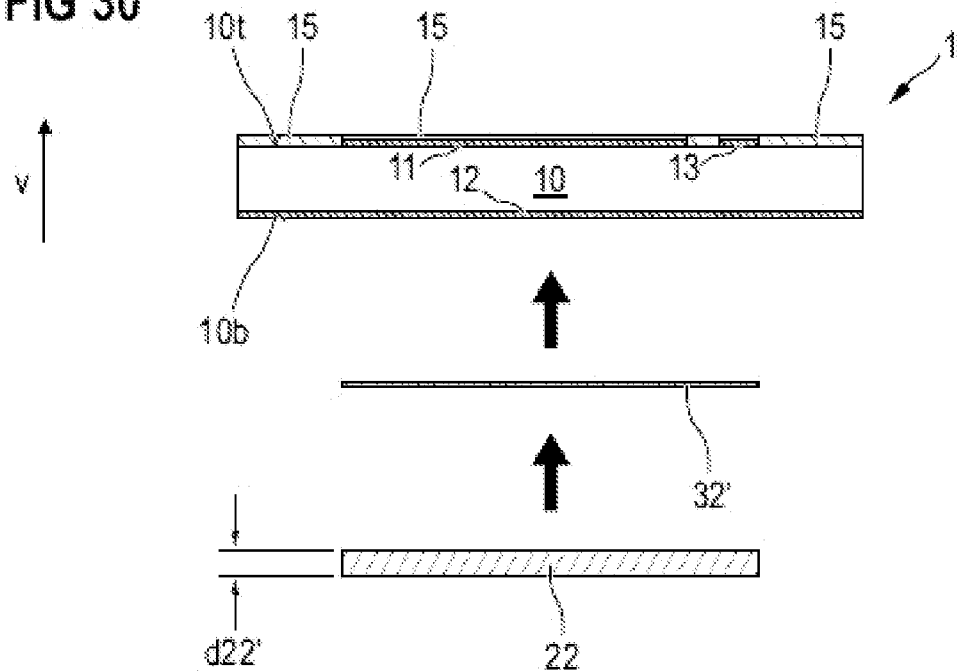
Figure 31:
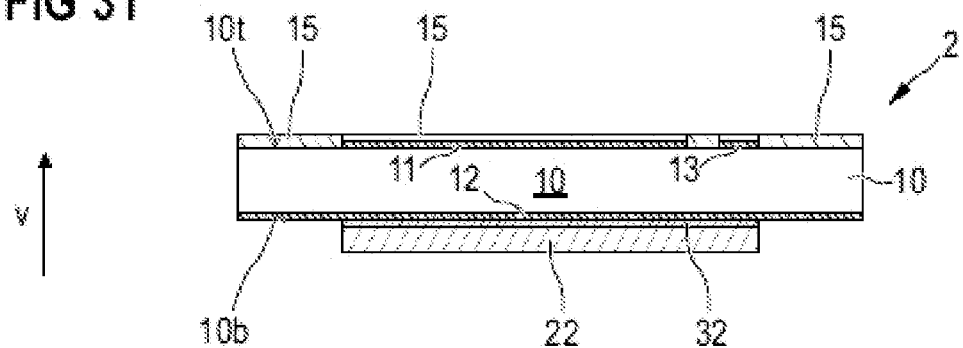

FIG. 30 shows a semiconductor chip 1 as well as further components for the production of a basic chip assembly 2 as represented in FIG. 31. The semiconductor chip 1 may be formed like, or produced in the same way as, the semiconductor chip 1 of the first exemplary embodiment.

As represented in FIG. 31, on the side of the lower main electrode 12 facing away from the semiconductor body 10 there is an electrically conductive lower compensating die 22, which is connected with a material bonded connection to the lower main electrode 12 by means of a lower connecting layer 32.

The lower compensating die 22 is used for the same purpose and may have the same properties as, and may be connected to the lower main electrode 12 in the same way as, the lower compensating die 22 according to the first exemplary embodiment. Accordingly, the lower connecting layer 32 may have the same structure, and be produced in the same way and from the same starting materials 32', as the lower connecting layer 32 according to the first exemplary embodiment.

Figure 32:
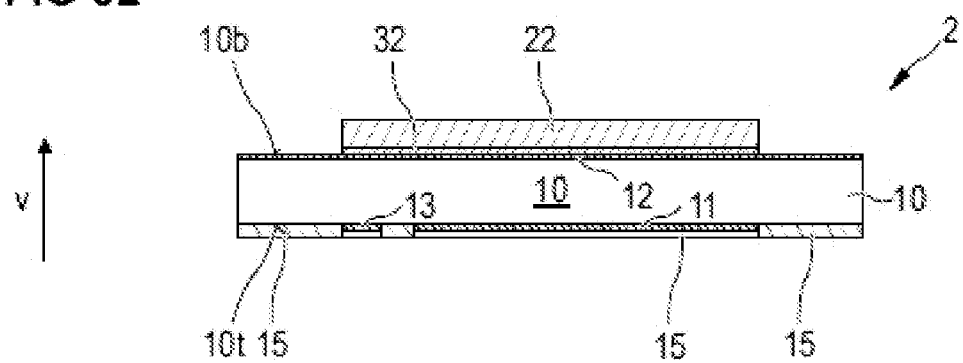
Figure 33:
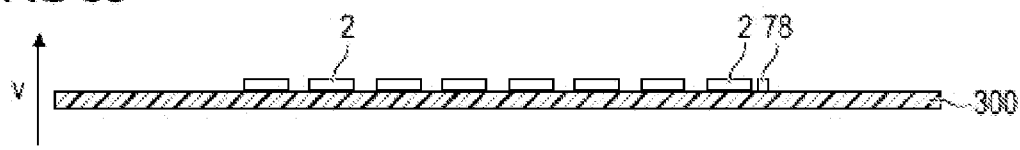

FIG. 32 shows the arrangement according to FIG. 31 in an inverted position. In this position, as is furthermore shown in FIG. 33, a plurality of basic chip assemblies 2, each of which has a structure as explained with the aid of FIGS. 30 and 31, are placed next to one another on the same side of a common carrier 300 in such a way that the upper sides 10*t* of the semiconductor chips 1 of the basic chip assemblies 2 face toward the carrier 300.

Optionally, an electrically conductive connection piece 78 as described above may also be placed next to the basic chip assemblies 2 on the carrier 300.

Figure 34:
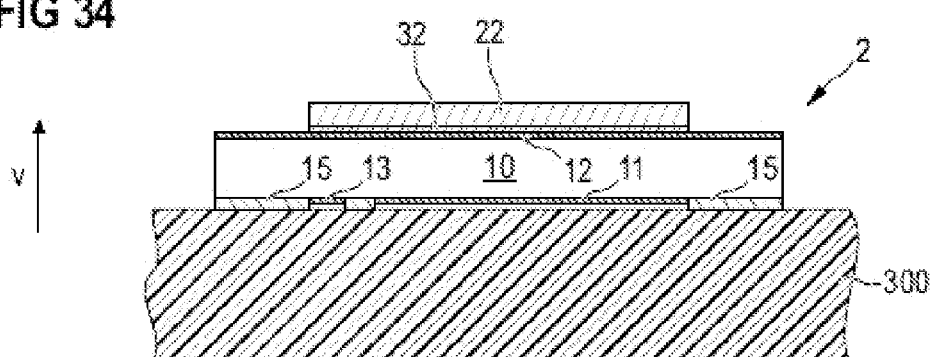

The placement of the basic chip assemblies 2, and optionally of the connection piece 78, on the carrier 300 may be carried out in such a way that they are in predetermined positions relative to one another. In order to avoid slipping of the placed basic chip assemblies 2, the surface of the carrier 300 may be formed in such a way that the basic chip assemblies 2, and optionally the connection piece 78, adhere thereon. To this end, for example, the carrier 300 may be provided with an adhesive film on which the basic chip assemblies 2, and optionally the connection piece 78, are placed. FIG. 34 shows an enlarged detail of the arrangement according to FIG. 33 with one of the basic chip assemblies 2 fixed on the carrier 300.

Figure 35:
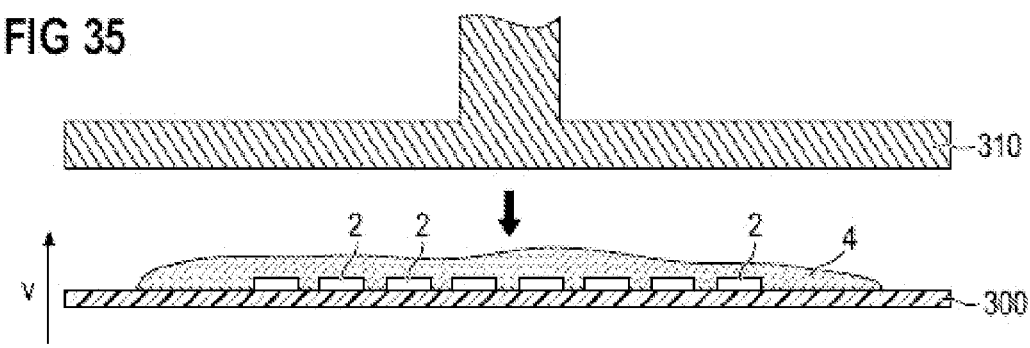
Figure 36:
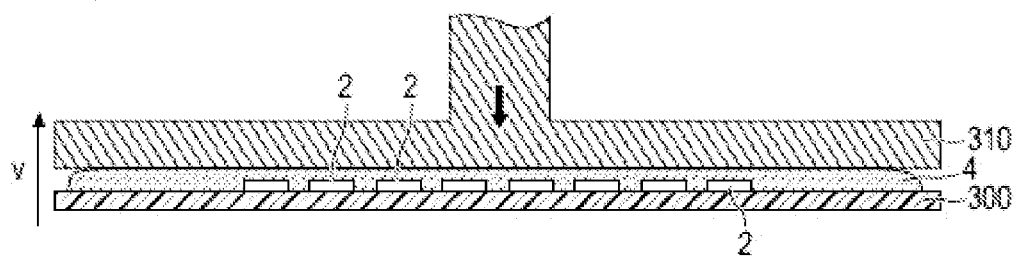
Figure 37:
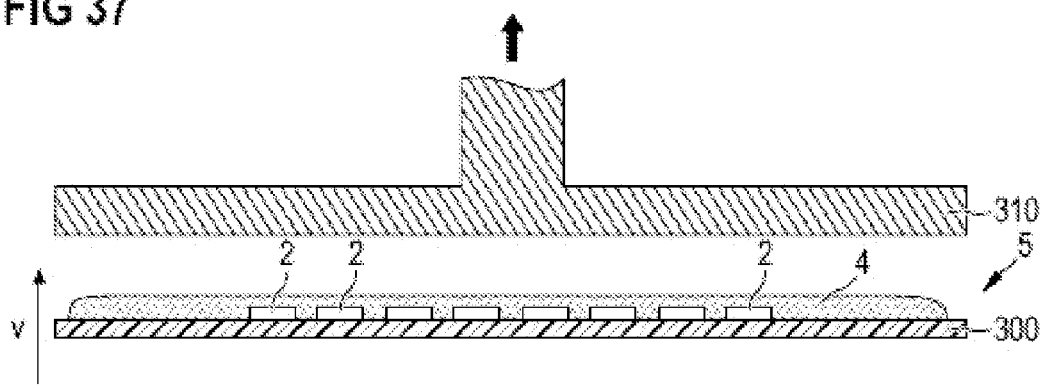

As is furthermore shown in FIG. 35, after the placement of the basic chip assemblies 2, and optionally of the connection piece 78, on the carrier 300, a viscous embedding compound 4 is applied over the basic chip assemblies 2, and optionally the connection piece 78, located on the carrier 300. The embedding compound 4 is then, as represented in FIG. 36, pressed against the carrier 300 by means of a die 310, in such a way that at least the intermediate spaces lying between respectively neighboring basic chip assemblies 2 are filled with the embedding compound 4.

Figure 38:
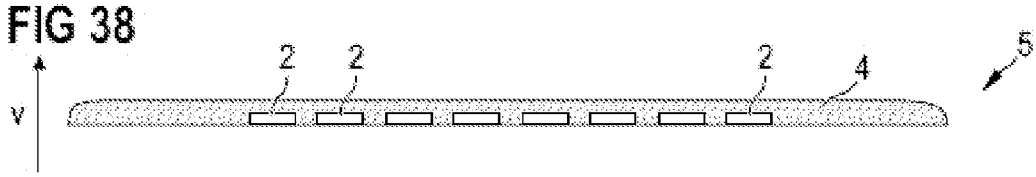

The embedding compound 4 is then cured, so that the basic chip assemblies 2 embedded in the embedding compound 4 form a solid assembly 5 together with the embedding compound 4. As is furthermore shown in FIG. 37, after the curing of the embedding compound 4 the die 310 may be raised from the solid assembly 5 and the assembly 5 may be removed from the carrier 300. FIG. 38 shows the assembly 5 then obtained. The effect of the embedding compound 4, which is dielectric at least in the cured state, is that the basic chip assemblies 2 are connected to one another firmly and with a material bonded connection. The embedding compound 4 may consist of the same materials, or be processed in the same way, and have the same properties, as the embedding compound 4 of the first exemplary embodiment.

Figure 39:
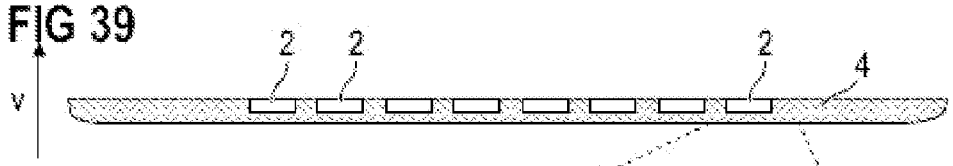
Figure 40:
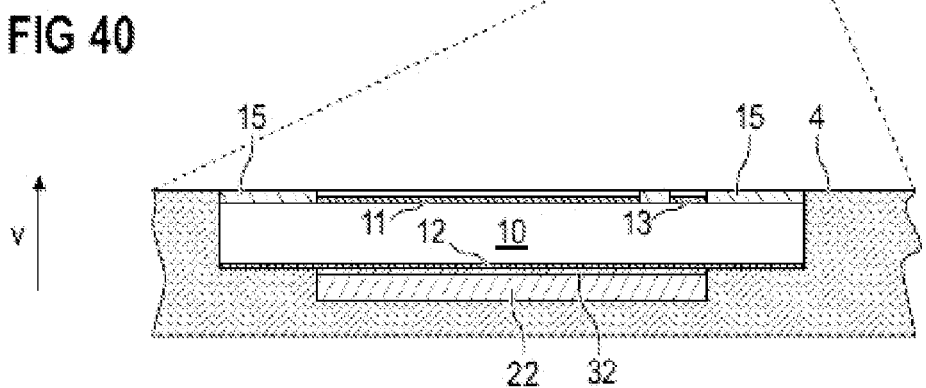
Figure 41:
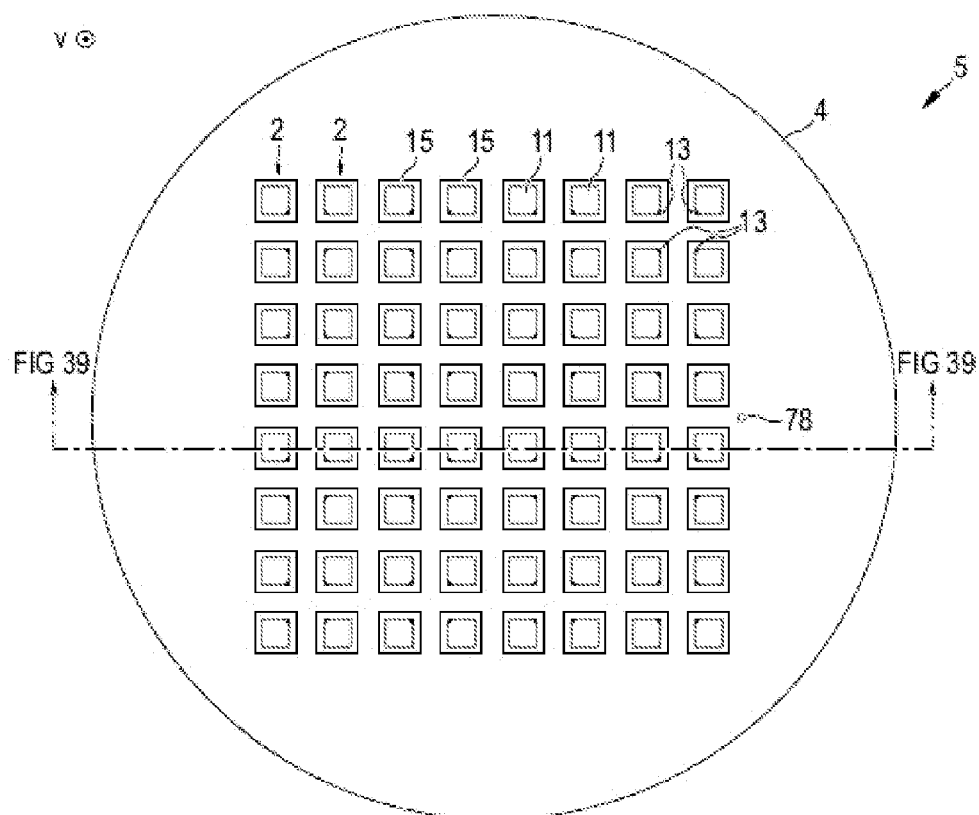

FIG. 39 shows the arrangement according to FIG. 38 inverted, FIG. 40 shows an enlarged detail of the arrangement according to FIG. 39 with one of the basic chip assemblies 2 embedded in the embedding compound 4, and FIG. 41 shows a plan view of the entire assembly 5 according to FIG. 39 with a view of the upper main contacts 11 and the control contacts 13. It can be seen from FIGS. 40 and 41 that the upper main electrodes 11 and the control electrodes 13 are not covered by the embedding compound 4, which results from the fact that they face toward the carrier 300 during the embedding in the embedding compound 4 and are protected by the carrier 300 from contact with the embedding compound 4. The upper main electrodes 11 and the control electrodes 13 are therefore exposed, so that they can be readily contacted electrically. Optionally, a careful cleaning step may also be carried out in order to free the upper main electrodes 11 and the control electrodes 13 of possible contamination.

Figure 42:
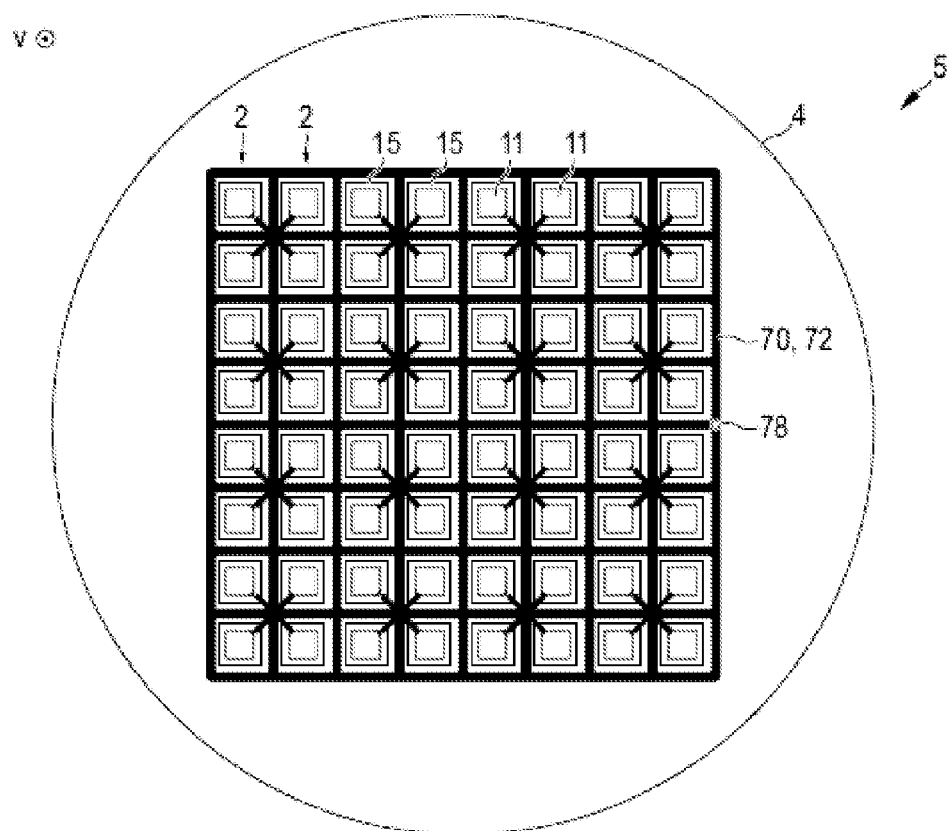

As is furthermore shown in FIG. 42, a control electrode interconnection structure 70 is applied onto the assembly 5 according to FIG. 41 in such a way that the control electrodes 13 of the basic chip assemblies 2, and optionally the connection piece 78, are electrically conductively connected to one another by a conductor structure 72 of a control electrode interconnection structure 70, and therefore by the control electrode interconnection structure 70.

The control electrode interconnection structure 70 may again be formed, for example, as a prefabricated printed circuit board in the form of a grid, or as a prefabricated electrically conductive lead frame, placed on the assembly 5 and electrically conductively connected to the control electrodes 13, and optionally to the connection piece 78. The corresponding electrically conductive connections may for example be established by means of a solder or a layer of a sintered metal powder, or an electrically conductive adhesive. In the case of an electrically conductive lead frame, the conductor structure 72 may for example be produced by stamping a metal sheet.

Instead of applying the control electrode interconnection structure 70 as a prefabricated unit onto the assembly 5, the conductor structure 72 of the control electrode interconnection structure 70 may also be applied onto the assembly 5 by a deposition method, and optionally covered with a dielectric layer 73, as shown by way of example below with the aid of FIGS. 43 and 44.

Figure 43:
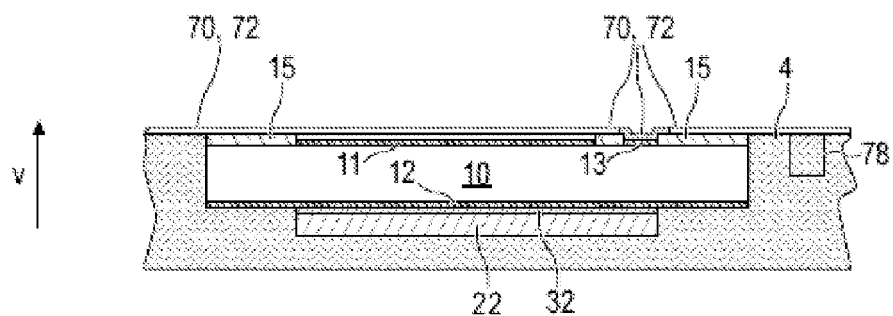

FIG. 43 shows an enlarged vertical section through a section of the assembly 5 with the conductor structure 72, applied thereon, of the control electrode interconnection structure 70. The position of the connection piece 78 covered by the embedding compound is represented by dashes. The conductor structure 72 contacts each of the control electrodes 13, and it extends above the connection piece 78 (if there is one) and likewise contacts the latter. The control electrodes 13 are therefore electrically conductively connected to one another as well as optionally to the connection piece 78.

The conductor structure 72 may for example be produced by depositing an electrically conductive material, for example a metal or a doped polycrystalline semiconductor material, onto the assembly 5. The deposition may, for example, be carried out by a chemical and/or physical deposition method, for example PVD (PVD=physical vapor deposition) CVD (CVD=chemical vapor deposition), by sputtering or by electrical or non-electrical plating. The deposition may be carried out conformally. The finished deposited conductor structure 72 may for example have a thickness in the range of from 30 μm to 70 μm.

In each of the methods mentioned above, a continuous layer of the electrically conductive material may first be produced on the assembly 5 and then structured, for example photolithographically by means of a mask. It is likewise possible first to apply a mask layer onto the assembly 5, to structure the mask layer so that it has openings, and then to apply the electrically conductive material onto the structured mask layer, so that the electrically conductive material lies on the assembly 5 in the region of the mask openings and electrically conductively connects the control electrodes 13, and optionally the connection piece 78, to one another so as to form the conductor structure 72.

In order to avoid electrical discharges between the conductor structure 72 of the control electrode interconnection structure 70 through the passivation 15, the passivation 15 may be used with a sufficient thickness, or an additional dielectric layer may optionally also be applied onto the passivation layer 15 before the deposition of the conductor structure 72. The additional dielectric layer would then be arranged between the passivation layer 15 and the conductor structure 72. The additional dielectric layer could likewise be applied onto the assembly 5 by conformal deposition. The upper main electrodes 12 would consequently not be covered, or at least not be covered completely, by the additional dielectric layer. In the case of surface-wide deposition of the additional dielectric layer, it would need to be opened in the region of the upper main electrodes 12 in order to permit their contacting. Organic polymers, polyimide, epoxy resin or silicone, for example, are suitable as materials for such an additional dielectric layer.

Figure 44:
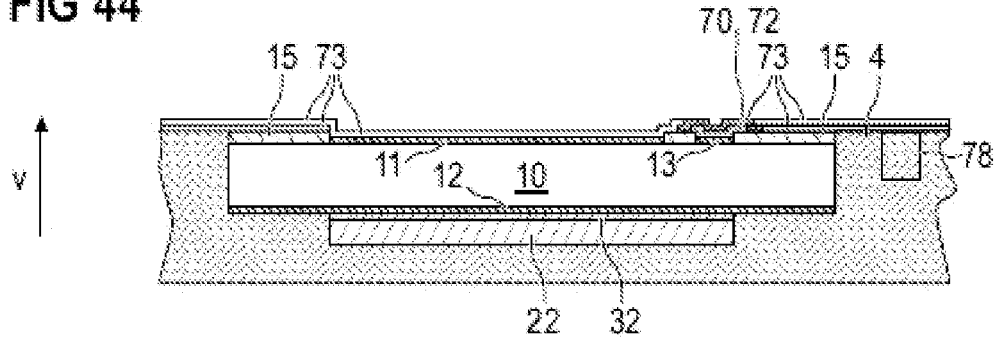

As is furthermore shown as a result in FIG. 44, a further, for example dielectric, layer 73 may optionally be applied onto the conductor structure 72 in order to electrically insulate it. The application of such a layer 73 may be carried out by any available technique. For example, a dielectric material may be applied onto the conductor structure 72 by deposition (for example PVD or CVD or sputtering). It is likewise possible to place or adhesively bond a stamped dielectric plate or a dielectric film onto the conductor structure 72.

Figure 45:
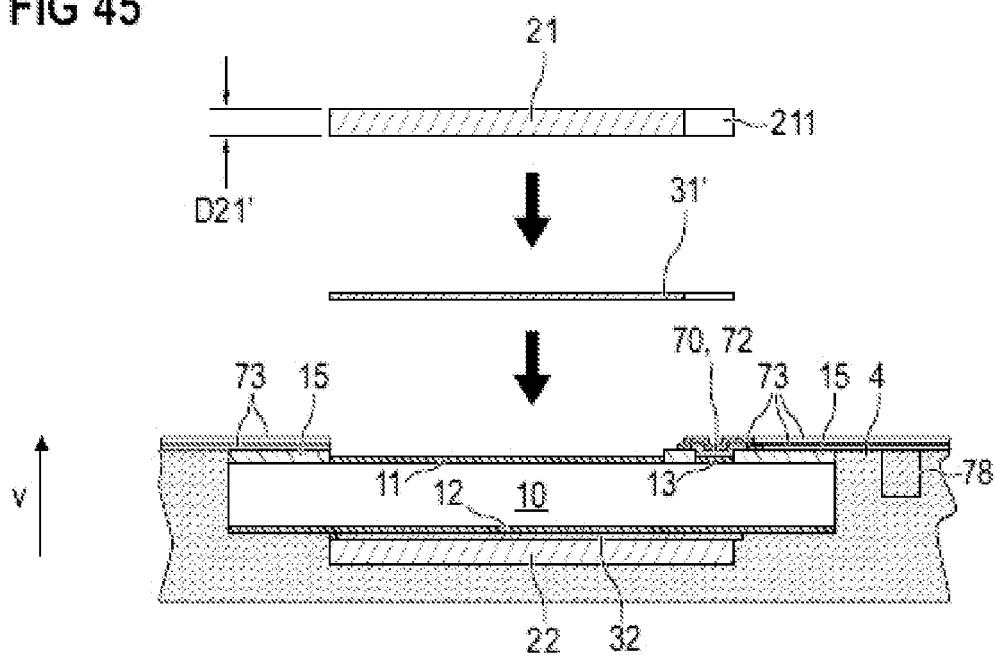
Figure 46:
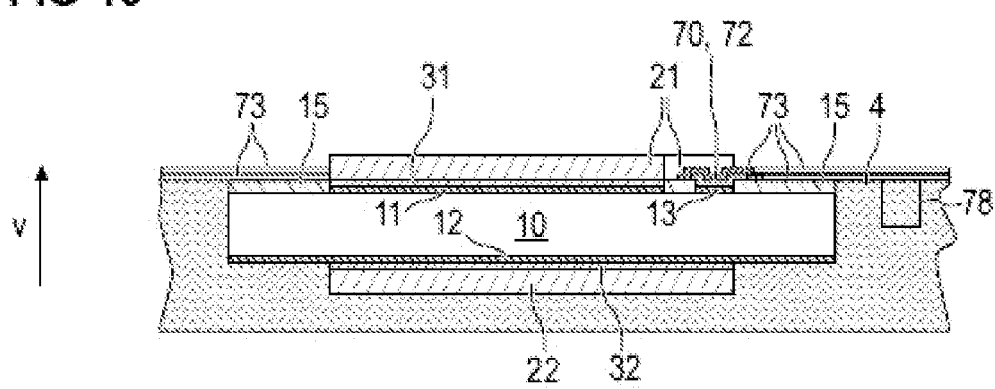

After the production of the assembly 5, it is not only possible to apply a control electrode interconnection structure 70 onto the assembly 5, but the upper main electrodes 11 may also respectively be provided with an upper compensating die 21, as represented in FIGS. 45 and 46.

The upper compensating die 21 is used for the same purpose and may have the same properties as, and may respectively be connected to one of the upper main electrodes 11 in the same way as, the upper compensating die 21 according to the first exemplary embodiment. Accordingly, the upper connecting layers 31 may have the same structure, and be produced in the same way and from the same starting material 31', as the upper connecting layer 31 according to the first exemplary embodiment. By an upper compensating die 21 being connected in this way to a semiconductor chip 1, it forms a part of the relevant basic chip assembly 2.

Before or after the application of the upper compensating dies 21, and before or after the application of the control electrode interconnection structure 70, the assembly 5 may optionally be applied onto a carrier 320 in such a way that the lower sides 10b of the semiconductor bodies 10 face toward the carrier 320, which is shown as a result in FIG. 46.

A further embedding compound 4' may then in turn in the same way be applied onto this arrangement, and then cured, as already explained with the aid of FIGS. 11 to 13 for the application of the embedding compound 4 onto the basic chip assemblies 2 located on the carrier 300. The embedding compound 4' may in this case have the same properties as the embedding compound 4. The embedding compound 4' and the embedding compound 4 may be identical or different.

As a result, an assembly 5' is obtained, as represented in FIG. 47 in detail (still on the carrier 320) and in FIG. 48 as a whole (separated from the carrier 320). FIGS. 47 and 48 show the assembly 5' before the removal here both of an upper cover layer 51 and of a lower cover layer 52. After the removal of these cover layers 51 and 52, a residual assembly 6 remains, as represented in FIG. 49 as a whole and in FIG. 50 as an enlarged detail.

In FIGS. 47 and 48, the plane E1 indicates the interface between the upper cover layer 51 and the residual assembly 6. Correspondingly, the plane E2 indicates the interface between the lower cover layer 52 and the residual assembly 6. The planes E1 and E2 preferably extend parallel to one another.

By the removal of the upper cover layer 51 and the lower cover layer 52 from the assembly 5', the cured embedding compounds 4, 4' are partially removed from the assembly 5'. Furthermore, for each of the basic chip assemblies 2, the upper compensating die 21 and the lower compensating die 22 of the relevant basic chip assembly 2 are respectively removed partially from the assembly 5'.

In each case, the embedding compound 4 and/or the further embedding compound 4' also ensure after the removal of the upper cover layer 51 and the lower cover layer 52 that the semiconductor chips 1 are connected to one another firmly and with a material bonded connection, and together with the embedding compound 4 form the residual assembly 6.

The removal of the upper cover layer 51 and the lower cover layer 52 may, for example, be carried out by processing (grinding, polishing, lapping, etc.) of the assembly 5' in a conventional wafer grinding system. The effect achievable by this is that the residual assembly 6 (apart from minor dishing effects) has plane-parallel surfaces 6t and 6b, on which the (ground) upper compensating dies 21 and the (ground) lower compensating dies 22 adjoin flush with the embedding compound 4.

After the removal of the upper cover layer 51 and the lower cover layer 52, the semiconductor chips 1, the upper connecting layers 31 and the lower connecting layers 32 of each of the basic chip assemblies 2 remain in the residual assembly 6. Furthermore, for each of the basic chip assemblies 2, the residue of the upper compensating die remaining after the removal of the upper cover layer 51 and the residue of the lower compensating die 22 remaining after the removal of the lower cover layer 52 are exposed.

After the removal of the upper cover layer 51, the thickness d21 of the upper compensating die 21 is reduced relative to its original thickness d21' (see FIG. 45), for example by about 0.1 mm. The reduced thickness d21 may, however, still be for example at least 0.4 mm, at least 0.9 mm or at least 1.4 mm.

Furthermore, the thickness d22 of the lower compensating die 22 is reduced by the removal of a lower cover layer 52 relative to its original thickness d22' (see FIG. 30), for example by about 0.1 mm. The reduced thickness d22 may, however, still be for example at least 0.4 mm, at least 0.9 mm or at least 1.4 mm.

As a result, for the residual assembly 6, in the same way as for the residual assembly 6 of the first exemplary embodiment (FIG. 16), optionally after form milling to produce a desired geometry, the connection piece 78 covered by the embedding compound 4, 4', or the control electrode interconnection structure 70 covered by the embedding compound 4, 4', or its conductor structure 72, may be electrically contacted by a connection electrode 75 and/or by a control line 9, as already explained with the aid of the first exemplary embodiment.

Furthermore, the residual assembly 6 may be arranged between an electrically conductive upper contact plate 41 and an electrically conductive lower contact plate 42, and optionally inside a dielectric spacer ring 50, in such a way that the upper contact plate 41 of each of the basic chip assemblies 2 electrically and mechanically contacts the compensating die 21, 22 (here the upper compensating die 21) facing toward the upper contact plate 41, and the lower contact plate 42 of each of the basic chip assemblies 2 electrically and mechanically contacts the compensating die 21, 22 (here the lower compensating die 22) facing toward the lower contact plate 42.

The upper contact piece 41 and the lower contact piece 42 may have the same properties, and consist of the same materials, as the upper contact piece 41 and the lower contact piece 42 of the first exemplary embodiment. FIG. 51 shows the finished semiconductor arrangement 7.

A third exemplary embodiment of a semiconductor arrangement, and a method for its production, will subsequently be explained with the aid of FIGS. 52 to 75. While in the first exemplary embodiment the semiconductor chips 1 of the basic chip assemblies 2 were respectively provided with two compensating dies 21 and 22 before the embedding in the embedding compound 4, and were respectively provided with one compensating die 22 in the second exemplary embodiment, the semiconductor chips 1 in the third exemplary embodiment are not provided with a compensating die before the embedding. Rather, the semiconductor chips 1 are provided with compensating dies 21 and 22 after the semiconductor chips 1 have been embedded in the embedding compound 4. The semiconductor chips 1 then respectively form a basic chip assembly 2.

Figure 52:
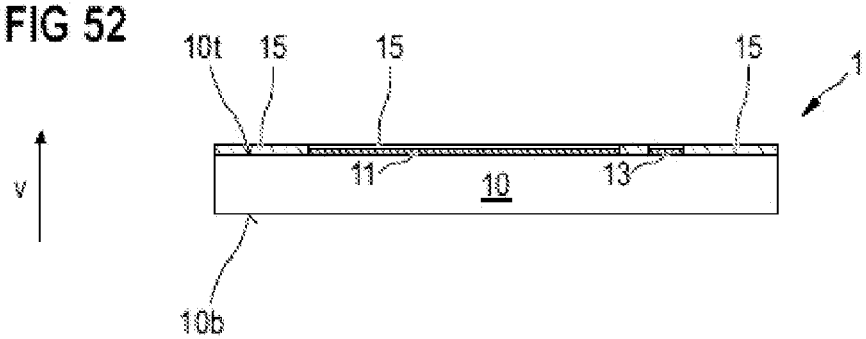
FIGS. 52 to 75 show the production of a semiconductor arrangement and of a semiconductor module according to a third exemplary embodiment.

FIG. 52 shows a semiconductor chip 1, which, apart from the lack of a lower main electrode 12, may be formed like, or produced in the same way as, the semiconductor chip 1 of the first exemplary embodiment. The lower side 10b of the semiconductor body 10 is thus exposed, i.e. it is formed by the semiconductor material of the semiconductor body 10.

Figure 53:
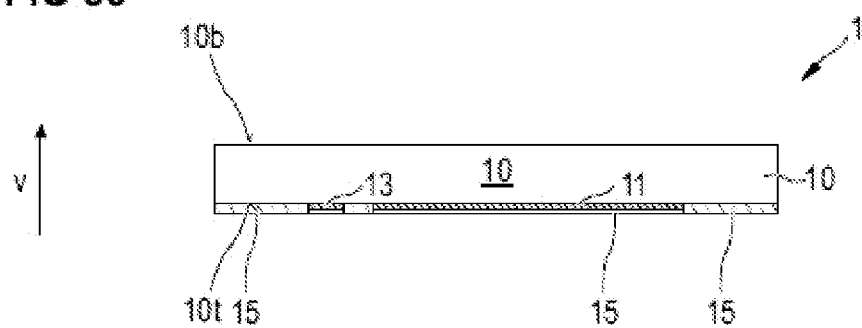
Figure 54:
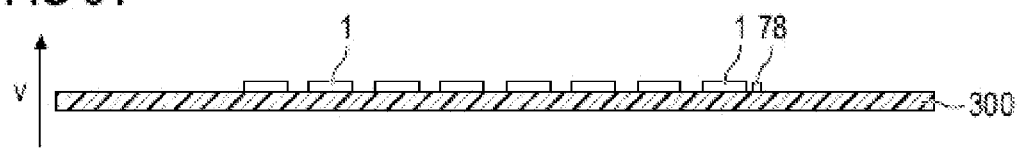
Figure 55:
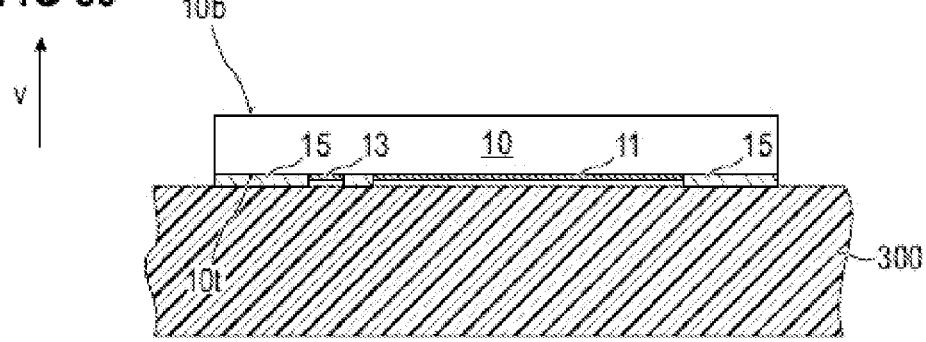

FIG. 53 shows the semiconductor chip 1 according to FIG. 51 in an inverted position. In this position, as furthermore shown in FIG. 54, a plurality of semiconductor chips 1 are placed next to one another on the same side of a common carrier 300 in such a way that the upper sides 10t of the semiconductor chips 1 face toward the carrier 300. FIG. 55 shows an enlarged detail of the arrangement according to FIG. 54 with a semiconductor chip 1 fixed on the carrier 300. As likewise represented in FIG. 54, an electrically conductive connection piece 78, as described above, may optionally also be placed on the carrier 300 next to the semiconductor chips 1.

The placement of the semiconductor chips 1, and optionally of the connection piece 78, on the carrier 300 may be carried out in such a way that they are in predetermined positions relative to one another. In order to avoid slipping of the placed basic chip assemblies 2, the surface of the carrier 300 may be formed in such a way that the semiconductor chip 1, and optionally the connection piece 78, adhere thereon. To this end, for example, the carrier 300 may be provided with an adhesive film on which the semiconductor chips 1, and optionally the connection piece 78, are placed.

Figure 56:
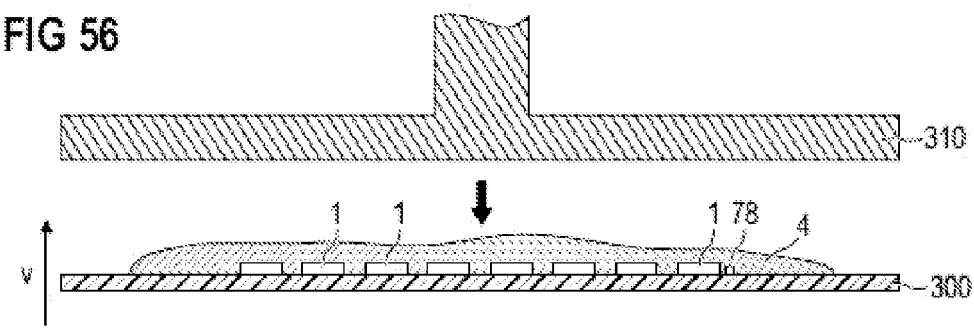

As is furthermore shown in FIG. 56, after the placement of the semiconductor chips 1, and optionally of the connection piece 78, on the carrier 300, a viscous embedding compound 4 is applied over the semiconductor chips 1, and optionally the connection piece 78, located on the carrier 300.

Figure 57:
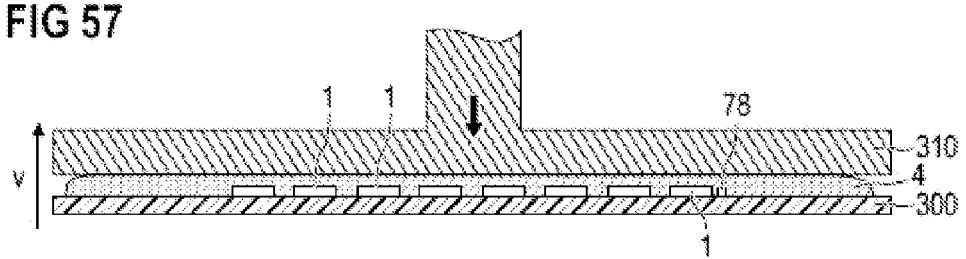

The embedding compound 4 is then, as represented in FIG. 57, pressed against the carrier 300 by means of a die 310, in such a way that at least the intermediate spaces lying between respectively neighboring semiconductor chips 1 are filled with the embedding compound 4.

The embedding compound 4 is then cured, so that the semiconductor chips 1 embedded in the embedding compound 4 form a solid assembly 5 together with the embedding compound 4.

Figure 58:
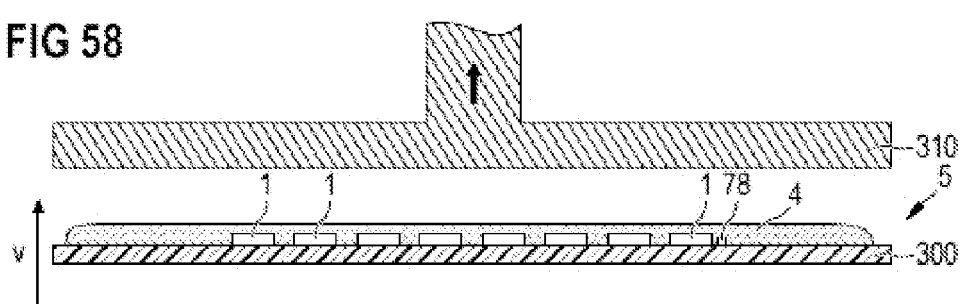

As is furthermore shown in FIG. 58, after the curing of the embedding compound 4 the die 310 may be raised from the solid assembly 5 and the assembly 5 may be removed from the carrier 300.

Figure 59:
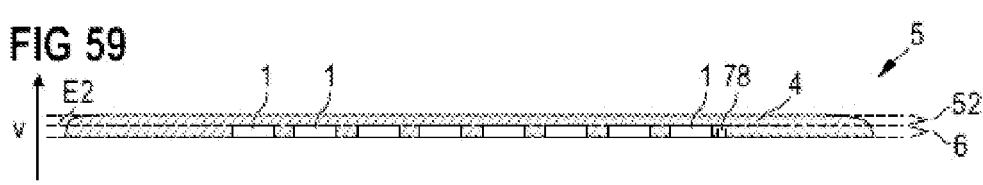

FIG. 59 shows the assembly 5 then obtained. The effect of the embedding compound 4, which is dielectric at least in the cured state, is that the semiconductor chips 1 are connected to one another firmly and with a material bonded connection. The embedding compound 4 may consist of the same materials, or be processed in the same way, and have the same properties, as the embedding compound 4 of the first exemplary embodiment.

Figure 60:
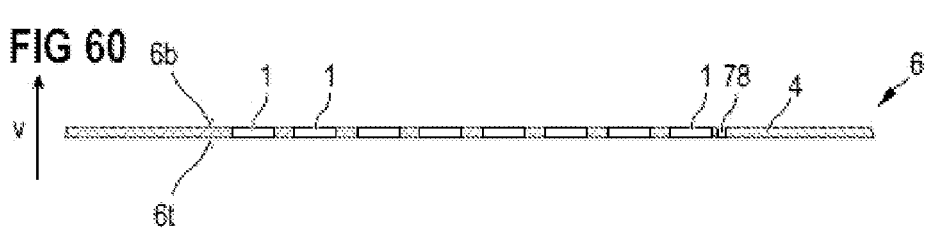

FIG. 59 shows the assembly 5 before removal of a lower cover layer 52. Since the semiconductor bodies 10 are inverted in the assembly, the lower cover layer 52 lies on top. After removal of this cover layer 52, a residual assembly 6 remains, as represented in FIG. 60. In FIG. 59, the plane E2 indicates the interface between the lower cover layer 52 and the residual assembly 6. The plane E2 defines the lower side 6b of the residual assembly 6, and it preferably extends parallel to the upper side 6t of the residual assembly.

By the removal of the lower cover layer 52 from the assembly 5, which may for example be carried out by processing (grinding, polishing, lapping, etc.) of the assembly 5 in a conventional wafer grinding system, the cured embedding compounds 4 are partially removed from the assembly 5. In each case, the embedding compound 4 also ensures after the removal of the lower cover layer 52 that the semiconductor chips 1 are connected to one another firmly and with a material bonded connection, and together with the embedding compound 4 form the residual assembly 6. After the removal of the lower cover layer 52, the semiconductor chips 1 thus remain in the residual assembly 6.

As is furthermore shown with the aid of FIGS. 61 to 66, an optional metallization level 92 is applied onto the lower side 6b of the residual assembly 6, which is for example done by a deposition method, for example by a chemical and/or physical deposition method, for example PVD (PVD=physical vapor deposition) or may be done by CVD (CVD=chemical vapor deposition), by sputtering or non-electrical plating.

Figure 61:
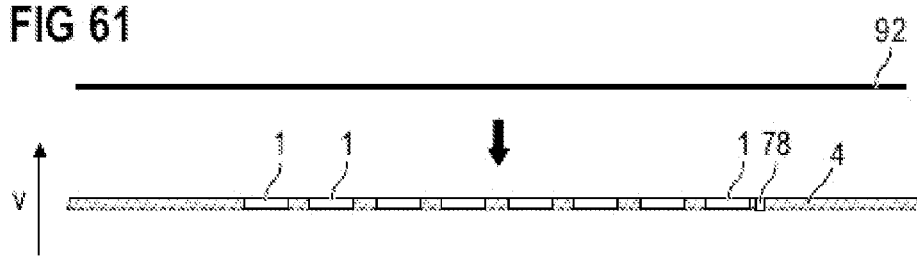
Figure 62:
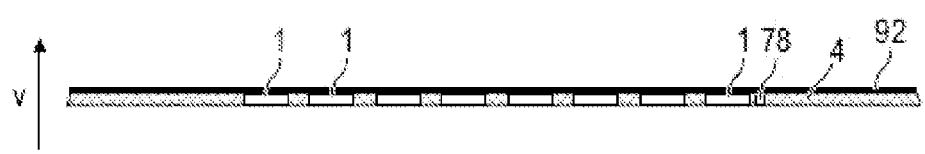
Figure 63:
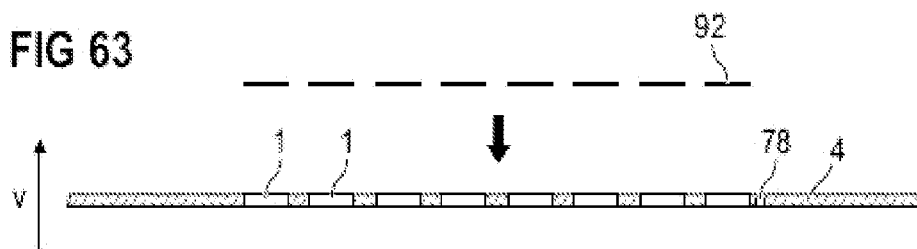
Figure 64:
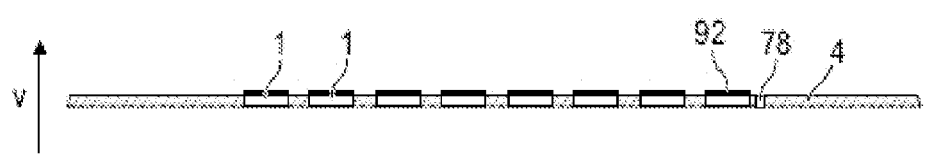

The applied metallization level 92 may, as shown in FIGS. 61 and 62, be applied as a continuous layer, or, as shown in FIGS. 63 and 64, as a structured layer. In the case of a structured layer, the structuring may be selected in such a way that all sections of the metallization level 92 exclusively contact the lower sides 10b of the semiconductor bodies 10. In each case, the metallization level 92 contacts the lower sides 10b of the semiconductor bodies 10. The metallization level 92 therefore constitutes a lower main electrode for each of the semiconductor chips 1. It furthermore fulfills the function of an adhesion promoter. It may be formed in one or more layers; in the case of a multilayer structure, it may also be formed as a sandwich. It may, for example, consist of titanium or comprise one or more titanium layers. Optionally, the metallization level 92 may also bear on the passivation layers 15 (if present) and/or on the embedding compound 4.

Figure 65:
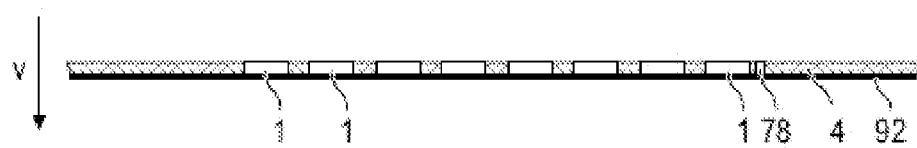
Figure 66:
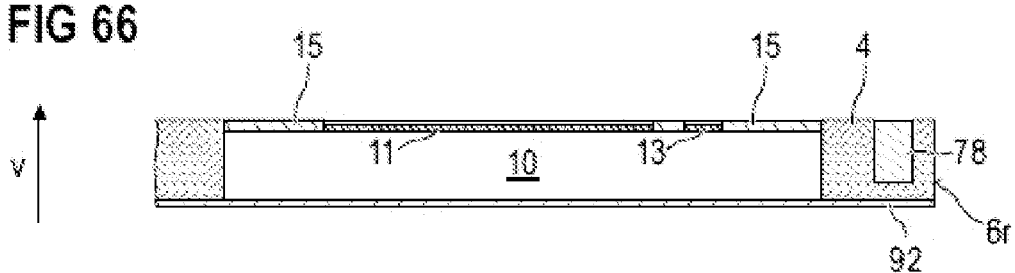

FIG. 65 shows by way of example the arrangement according to FIG. 62 in an inverted position, and FIG. 66 shows an enlarged detail of the arrangement, specifically after the optional form milling of the arrangement in order to achieve a desired geometry. The form milling may, as in all other configurations of the invention, be carried out at any desired time after the pressing of the semiconductor chip 1 into the embedding compound 4. The enlarged detail according to FIG. 66 also shows a side edge 6r of the residual assembly 6, as well as the optional connection piece 78 embedded in the embedding compound 4 in the vicinity of the side edge 6r.

Figure 69:
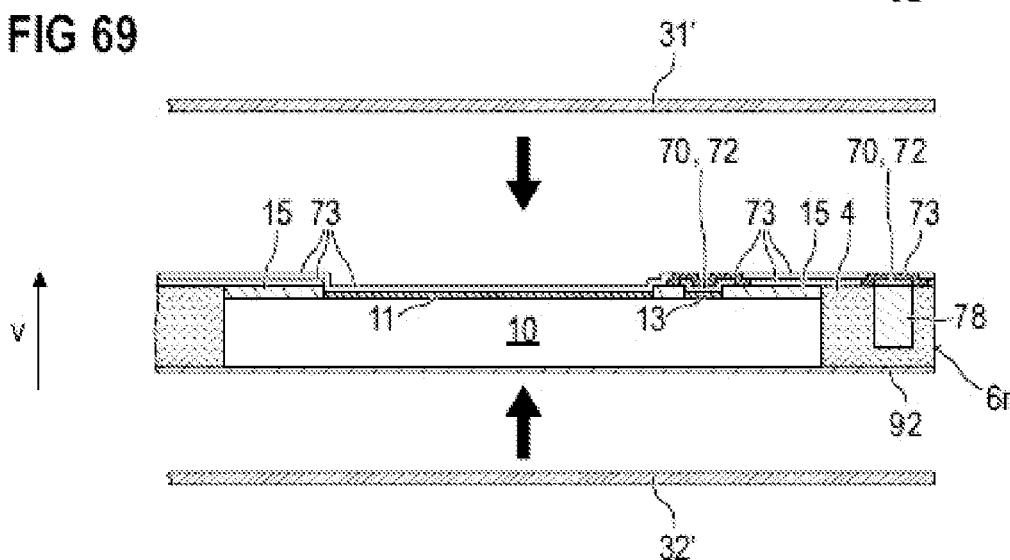

As furthermore represented in FIG. 69, a control electrode interconnection structure 70 is applied onto the arrangement according to FIG. 66, in such a way that the control electrodes 13 of the basic chip assemblies 2, and optionally the connection piece 78, are electrically conductively connected to one another by a conductor structure 72 of the control electrode interconnection structure 70, and therefore by the control electrode interconnection structure 70.

The control electrode interconnection structure 70 may for example again be formed as a prefabricated printed circuit board in the form of a grid, or as a prefabricated electrically conductive lead frame, placed on the residual assembly 6 and electrically conductively connected to the control electrodes 13, and optionally to the connection piece 78. The corresponding electrically conductive connections may, for example, be established by means of a solder or a layer with a sintered metal powder, or an electrically conductive adhesive or by means of a pure pressure contact connection. In the case of an electrically conductive lead frame, the conductor structure 72 may for example be produced by stamping a metal sheet.

Figure 67:
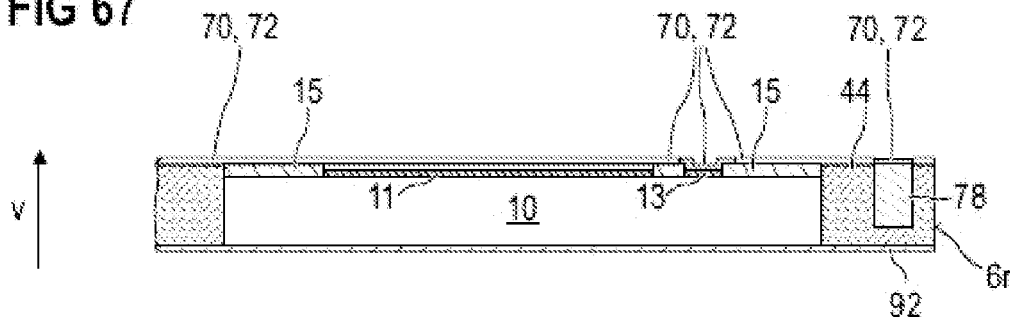
Figure 68:
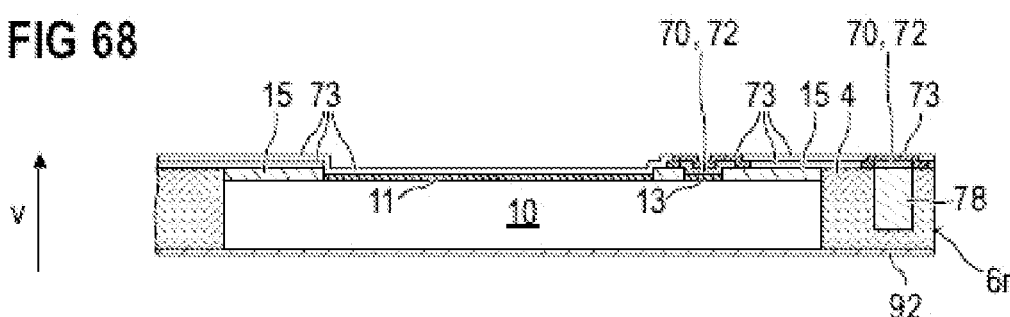
Figure 70:
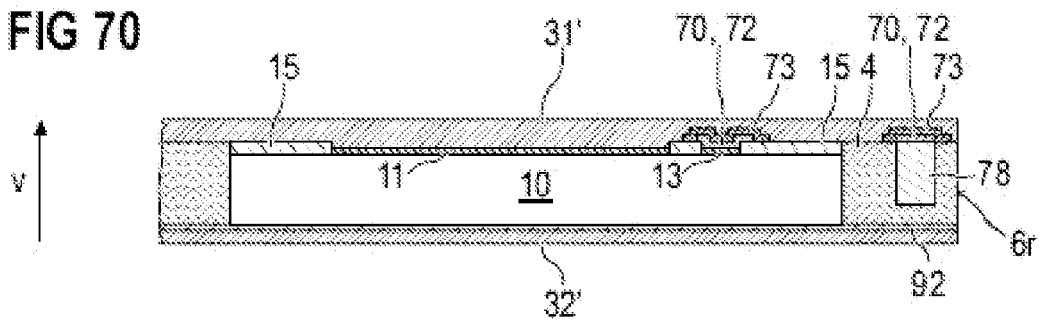

Instead of applying the control electrode interconnection structure 70 as a prefabricated unit onto the residual assembly 6, the conductor structure 72 of the control electrode interconnection structure 70 may also, as shown as a result in FIG. 67, be applied onto the residual assembly 6 by a deposition method, and, as shown as a result in FIG. 68, covered with a dielectric layer 73. The dielectric layer 73 protects the conductor structure 73 and the control electrodes 13 from contact with a starting material 31' for the production of an upper connecting layer 31, which is represented in FIG. 69 and, as shown as a result in FIG. 70, is applied over the control electrode interconnection structure 70 and its conductor structure 72, as well as over the control electrodes 13 and the upper main electrodes 11, onto the residual assembly 6. Furthermore, application is furthermore carried out onto the one starting material 32' for the production of a lower connecting layer 32, over the lower main electrodes 12 and—if provided as in the present example—over the metallization level 92. As may be seen clearly in particular with the aid of the starting material 31' in FIG. 70, the starting material 31', but also the starting material 32', may be used in order to compensate for irregularities of the surface of the residual assembly 6.

As an alternative, however, it is likewise possible to apply the starting material 31' in a structured way only above the upper main electrodes 11, but not above the control electrodes 13 and not above a conductor structure 72 of the control electrode interconnection structure 70. In this case, the dielectric layer 73 may optionally be omitted.

Figure 71:
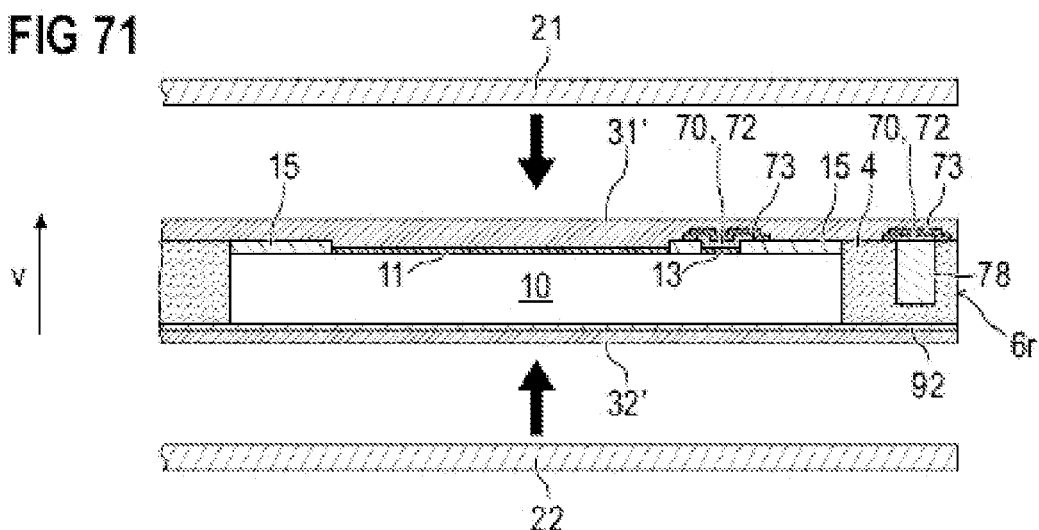
Figure 72:
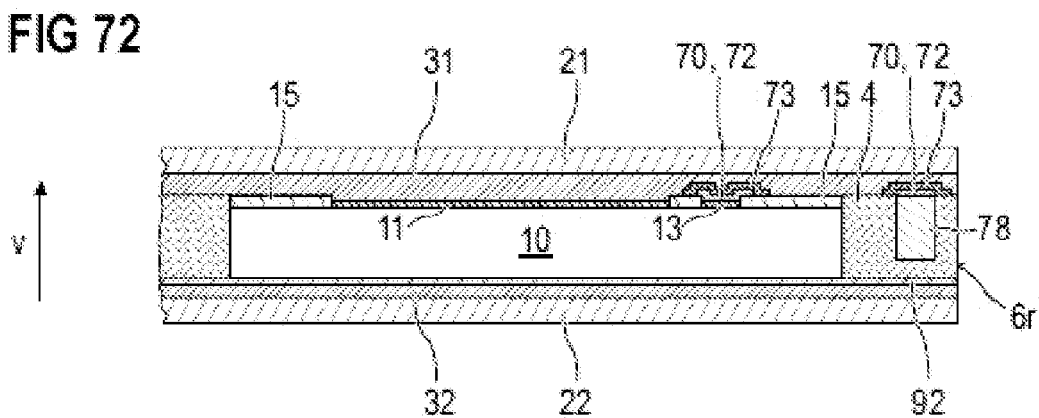
Figure 73:
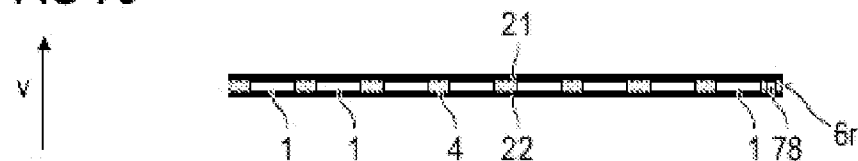

The starting material 31' is used in order to produce an upper connecting layer 31, which connects the upper main electrodes 11 with a material bonded connection and electrically conductively to a common upper compensating plate 21. Correspondingly, the starting material 32' is used in order to produce a lower connecting layer 32, which connects the lower main electrodes 12 with a material bonded connection and electrically conductively to a common lower compensating plate 22, as represented in FIG. 71 and as a result in FIG. 72. FIG. 73 shows the entire arrangement of FIG. 72.

The upper compensating plate 21 and the lower compensating plate 22 are used for the same purpose and (apart from the large extent perpendicular to the vertical direction v) may have the same properties as, and may respectively be connected to the upper main electrodes 11 and the lower main electrodes 12 in the same way as, the upper compensating dies 21 and the lower compensating dies 22 according to the first exemplary embodiment. Accordingly, the upper connecting layer 31 and the lower connecting layer 32 may have the same structure, and be produced in the same way and from the same starting materials 31' and 32', as the upper connecting layer 31 and the lower connecting layer 32, respectively, according to the first exemplary embodiment.

As a result, for the residual assembly 6 provided with the compensating plates 21, 22, in the same way as for the residual assembly 6 of the first exemplary embodiment (FIG. 16) the connection piece 78 covered by the embedding compound 4 or the control electrode interconnection structure 70 covered by the embedding compound 4, or its conductor structure 72, may be electrically contacted by a connection electrode 75 and/or by a control line 9, as already explained with the aid of the first exemplary embodiment.

Furthermore, the residual assembly 6 may be arranged between an electrically conductive upper contact plate 41 and an electrically conductive lower contact plate 42, and optionally inside a dielectric spacer ring 50, in such a way that the upper contact plate 41 electrically and mechanically contacts the upper compensating plate 21, and the lower contact plate 42 electrically and mechanically contacts the lower compensating plate 22.

Figure 74:
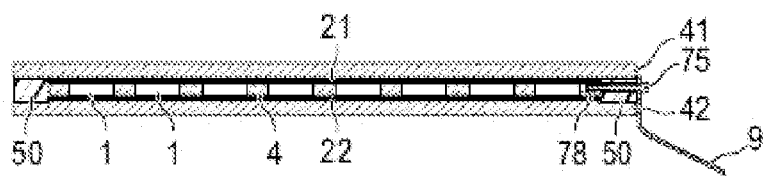
Figure 75:
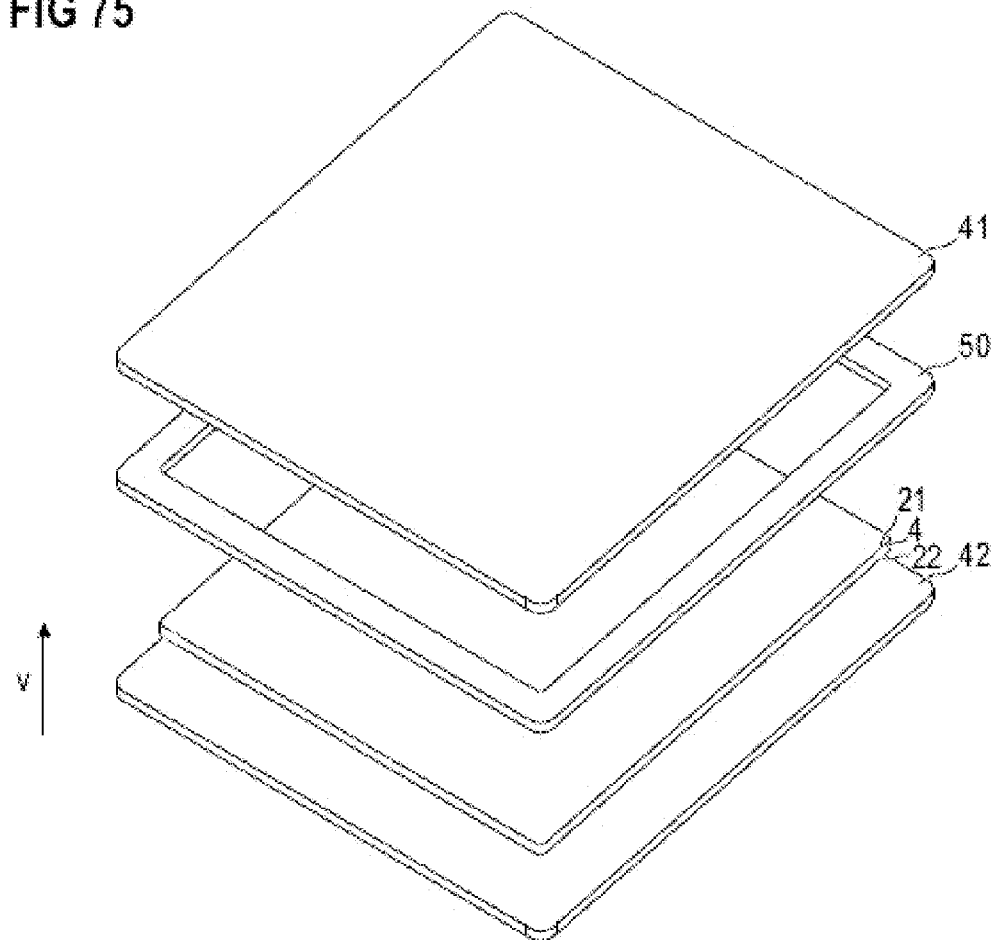

The upper contact piece 41 and the lower contact piece 42 may have the same properties, and consist of the same materials, as the upper contact piece 41 and the lower contact piece 42 of the first exemplary embodiment. FIG. 74 shows the finished semiconductor arrangement 7, and FIG. 75 shows an exploded representation thereof.

Although the upper contact piece 41 and/or the lower contact piece 42 may optionally have an upper contact elevation 411 and a lower contact elevation 421, as described above, for the contact pieces 41 and 42 such contact elevations 411 and 421 may be omitted since the contact pieces 41, 42 respectively do not need to contact a plurality of separate compensating dies 21 or 22, but respectively only one compensating die 21 or 22. For example, the upper contact piece 41 and/or the lower contact piece 42 may respectively be formed as a plane metal plate, which simplifies production.

Figure 78:
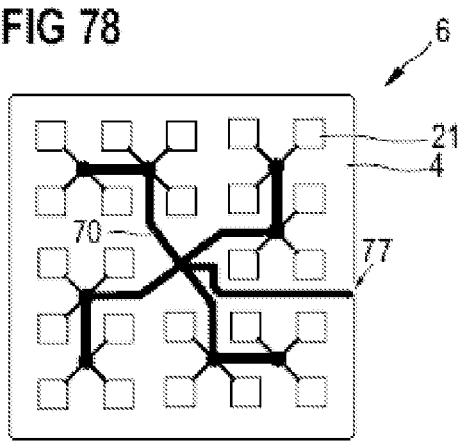

In order to achieve simultaneous switching on and off in the case of semiconductor chips 1 which have identical switching thresholds for switching on and off, provision may be made for the resistances which the conductor structure 72 has between its connection point 77 and the control electrode 13 of each of the semiconductor chips 1 to be identical. In the case of a homogeneous material or a homogeneous material structure of the conductor structure 72, this can be achieved in all configurations and exemplary embodiments of the invention most simply by the conduction lengths which the conductor structure 72 respectively has between its connection point 77 and the control electrodes 13 being of equal length. An example of this is shown in FIG. 78. The connection point 77 is in this case given by the point of the conductor structure 72 at which the conductor structure 72 is connected to a connection piece 78 (if there is one), or to a connection electrode 75 or a control line 9.

Figure 76:
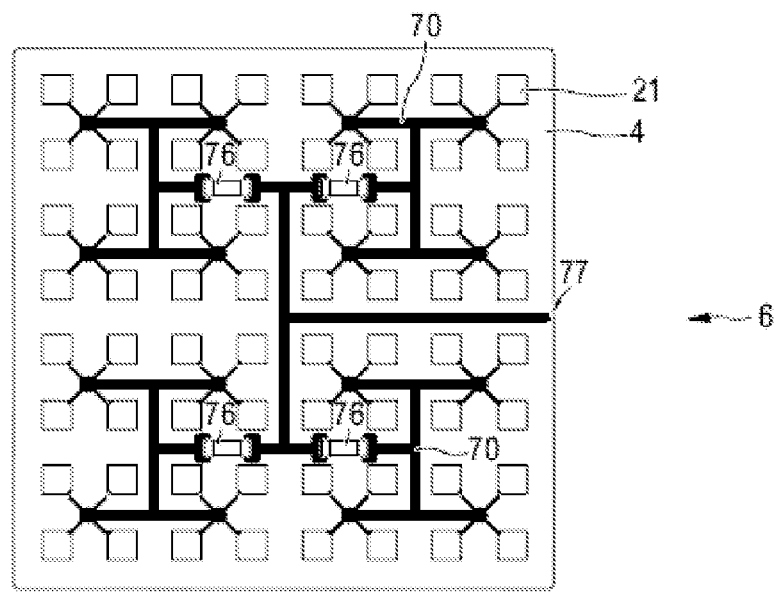
FIGS. 76 to 79 show various geometries of control electrode interconnection structures for the production of a semiconductor arrangement, in which control terminals of all the basic chip assemblies are connected by connection lines of equal length to a common control terminal point of the basic chip assemblies.
Figure 77:
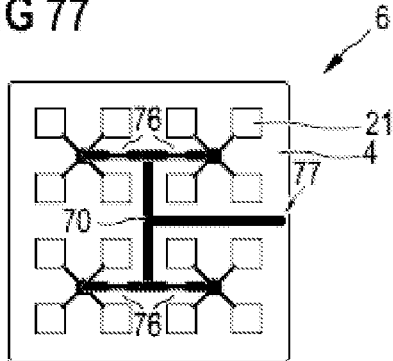
Figure 79:
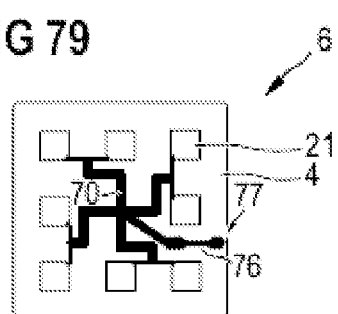

FIGS. 76, 77 and 79 show yet another alternative configuration, according to which the control electrode interconnection structure 70 may also have one or more passive components 76, which are embedded in the embedding compound 4. The passive component 76 may for example be resistors, but also any other desired passive components, for example capacitors or inductors. An example of one or more integrated gate resistors 76 is represented in FIGS. 76, 77 and 79. Such a gate resistor 76 may respectively be connected in front of only one, or alternatively a plurality or all of the control electrodes 13. Such a gate resistor 76 may, for example, have a resistance of at least 2 ohms.

As represented in FIG. 76, a passive component 76 may be mounted on a conductor structure 72 of the control electrode interconnection structure 70, for example in SMT technology (Surface Mount Technology) or in thick-film technology. Likewise, however, it is possible for a passive component 76 to constitute a part of the conductor structure 72 of the control electrode interconnection structure 70, as shown in FIGS. 77 and 79. The examples shown each involve a resistor 76, which is formed by local cross-sectional constriction of the conductor structure 72. The resistors 76 are placed either before each semiconductor chip 1 or before a multiplicity of semiconductor chips 1 connected in parallel with one another. For example, the control electrodes 13 of two, three or four semiconductor chips 1 connected in parallel may be connected via a common gate resistor 76 to the common connection point 77.

With the aid of FIGS. 9 to 13, a method with which a plurality of semiconductor chips 1 can be embedded in a common embedding compound 4 was explained above. An alternative method to this will now be explained with the aid of FIGS. 80 and 81.

Figure 80:
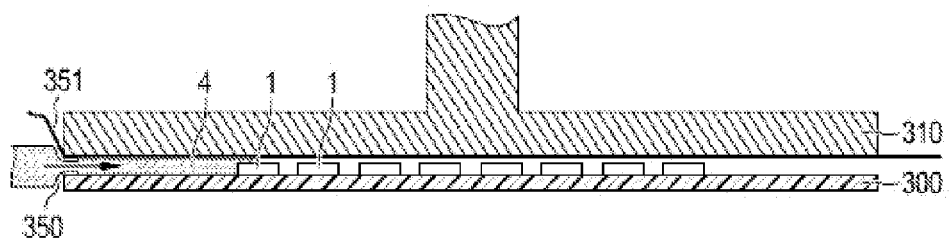
FIGS. 80 and 81 show various steps of a further method for embedding a plurality of basic chip assemblies in an embedding compound.

First, as already described, an arrangement is produced in which the semiconductor chips 1 are arranged next to one another on a common carrier 300, as shown as a result by way of example in FIG. 4. The die 310 is then placed above the semiconductor chips 1 in such a way that the semiconductor chips 1 are arranged between mutually parallel surface sections of the carrier 300 and of the die 310. Furthermore, a separating film 351 is placed between the die 310 and the semiconductor chip 1. While preserving this arrangement, the embedding compound 4 is then, as represented in FIG. 80, injected between the separating film 351 and the carrier 300 by using an injection device 350, in such a way that at least the intermediate spaces respectively lying between neighboring semiconductor chips 1 are filled with the embedding compound 4. The die 310 is protected from contact with the embedding compound 4 by the separating film 351.

Figure 81:
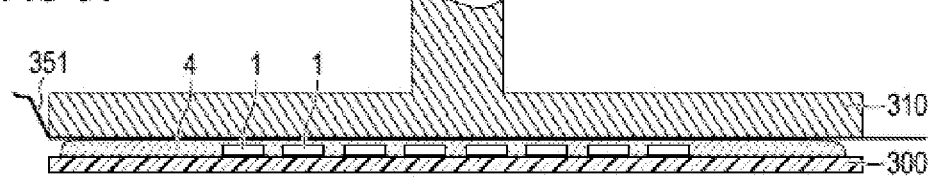

FIG. 81 shows the arrangement after the end of the injection process and with the injection device 350 removed. After the curing of the embedding compound 4, the die 310, the separating film 351 and the carrier 300 can then be removed from the assembly comprising the semiconductor arrangements 2 and the cured embedding compound 4.

With the aid of the examples explained so far, it has been shown that a plurality or all of the semiconductor chips 1 of a semiconductor arrangement 7 may be identical. It is, however, also possible to use the present invention for a semiconductor arrangement 7 of different and/or differently spatially oriented semiconductor chips 1 and connect these with a material bonded connection to one another by the embedding compound 4. As an example, two different semiconductor chips 1, the semiconductor bodies 10 of which have different thicknesses, may be mentioned. The different thicknesses of the semiconductor chips 1 may advantageously be compensated for by using differently thick upper and/or lower compensating dies 21 and 22. One semiconductor chip 1 is for example a controllable semiconductor component, for example a MOSFET or an IGBT, and the other semiconductor chip 1 is a diode. In the finished semiconductor arrangement 7, comprising an upper and a lower contact plate 41 and 42, the diode may for example be formed as a freewheel diode which is electrically connected between the upper main electrode 11 and the lower main electrode 12 of the controllable semiconductor component. The residual assembly 6 of the semiconductor arrangement 7 has an upper side 6t and a plane lower side 6b parallel thereto.

Furthermore, the different thicknesses (in the vertical direction v) of semiconductor bodies 10 of different semiconductor chips 1 may also be compensated for by the upper connecting layer 31 and/or by the lower connecting layer 32, so that the residual assembly 6 of the semiconductor arrangement 7 has mutually opposite plane-parallel upper sides 6t and lower sides 6b.

In the exemplary embodiments explained so far, the upper sides 6t and the lower sides 6b of the residual assembly 6 were respectively plane-parallel. If these residual assemblies 6 respectively have mutually independent upper and/or lower compensating dies 21 and 22, the associated upper contact plate 41 or lower contact plate 42 was provided with contact elevations 411 and 421, each of which was used for contacting a different upper or lower compensating die 21 or 22.

It will now be explained below that, in the case of a semiconductor arrangement 7 of which the residual assembly 6 mounted between the contact plates 41 and 42 has a plurality of mutually independent upper compensating dies 21 and/or a plurality of mutually independent lower compensating dies 22, the use of simply configured upper and lower contact plates 41 and 42 can nevertheless be achieved. Simply configured contact plates 41 and 42 are intended to mean contact plates which do not have contact elevations 411 or 421, but have a structure which is simpler to produce, for example respectively a plane surface section which constitutes a plane electrical contact surface that contacts all the upper or lower compensating dies 21 or 22.

The starting point is a semiconductor arrangement 7, the residual assembly 6 of which has plane and mutually parallel upper sides 6t and lower sides 6b. If this residual assembly 6 has a plurality of mutually separated upper compensating dies 21, a part of the upper side 6t is formed by the embedding compound 4. In order to make these upper compensating dies 21 protrude out of the embedding compound 4, so that they can be contacted by a plane contact surface of an upper contact plate 41, the embedding compound 4 may be lowered relative to the original upper side 6t of the residual assembly 6.

The same applies correspondingly for the case in which the residual assembly 6 of the semiconductor arrangement 7 has a plurality of mutually separated lower compensating dies 22. Then, specifically, a part of the lower side 6b is formed by the embedding compound 4. In order to make these lower compensating dies 22 protrude out of the embedding compound 4, so that they can be contacted by a plane contact surface of a lower contact plate 42, the embedding compound 4 may be lowered relative to the original lower side 6b of the residual assembly 6.

In principle, it is possible to lower the embedding compound 4 only on the upper side 6t or only on the lower side 6b of the residual assembly 6, and only there to use an upper or lower contact plate 41 or 42 having a plane contact surface with the relevant compensating die 21 or 22, while the other, lower or upper contact plate 41 or 42 is provided with contact elevations 421 or 411.

Figure 82:
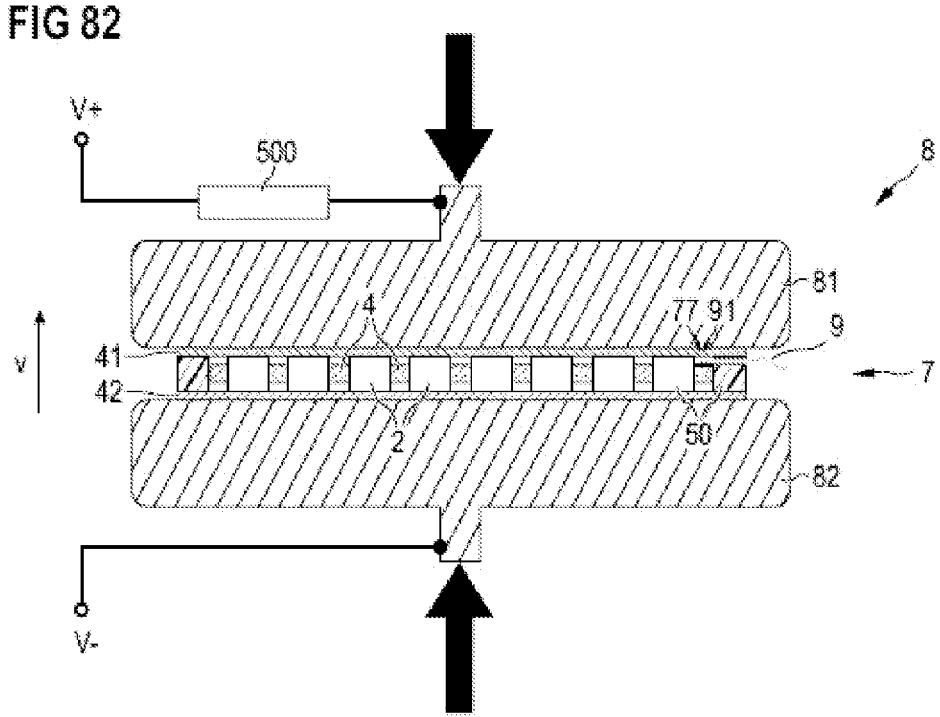
FIG. 82 shows a semiconductor arrangement, which is clamped between two electrically conductive pressure pieces and is electrically contacted by the latter.

A semiconductor arrangement 7 according to the present invention may then, as shown by way of example in FIG. 82, be clamped between an electrically conductive upper pressure piece 81 and an electrically conductive lower pressure piece 82, in such a way that there is respectively an electrical pressure contact connection between the upper pressure piece 81 and the upper contact plate 41, and between the lower pressure piece 82 and the lower contact plate 42. The finished pressure contact arrangement 8 comprising the semiconductor arrangement 7, the upper pressure piece 81 and the lower pressure piece 82, may then be electrically interconnected. For example, the pressure contact arrangement 8 may be connected in series with a resistive and/or inductive load 500 between a positive supply potential V+ and a negative supply potential V−.

Furthermore, a plurality of, here merely by way of example nine, separate residual assemblies 6 lying next to one another may also be combined to form a larger unit 60, so that they can be arranged between a common upper contact plate 41 and a lower contact plate 42 and respectively electrically contacted by these contact plates 41, 42.

Each of these residual assemblies 6 may for example comprise four semiconductor chips 10 arranged in two rows and two columns, nine semiconductor chips 10 arranged in three rows and three columns, or, as shown, nine semiconductor chips arranged in three rows and three columns.

In all configurations of the present invention, the control electrode interconnection structure 70 may be embedded in the embedding compound 4. In this case, the side of the control electrode interconnection structure 70 facing away from the semiconductor bodies 100 can be covered fully or at least partially by a part of the embedding compound 4.

In principle, in a semiconductor arrangement in the sense of the present invention, any desired number of mutually separated semiconductor bodies 100 may be firmly connected to one another by the embedding compound 4. The number may for example be at least 9, at least 25 or at least 36.

It should be pointed out that the features and method steps of the exemplary embodiments explained may be combined with one another, unless otherwise mentioned.

What is claimed is:

1. A semiconductor arrangement, comprising:
   an upper contact plate and a lower contact plate;
   a number of basic chip assemblies, each of which has:
   a semiconductor chip having a semiconductor body, the semiconductor body having an upper side and a lower side opposite the upper side, and the upper side being separated from the lower side in a vertical direction;
   an individual upper main electrode arranged on the upper side; and
   an individual control electrode arranged on the upper side;
   wherein the basic chip assemblies have either respectively a separate lower main electrode, which is arranged on the lower side of the semiconductor chip of the relevant basic chip assembly, or a common lower main electrode, which for each of the basic chip assemblies is arranged on the lower side of the semiconductor body of that basic chip assembly;
   wherein, for each of the basic chip assemblies, an electrical current between the individual upper main electrode and the individual or common lower main electrode is controllable by means of its control electrode;

a dielectric embedding compound, by which the basic chip assemblies are connected to one another with a material bonded connection so as to form a solid assembly;

a control electrode interconnection structure, which is embedded in the solid assembly and which electrically conductively connects the control electrodes of the basic chip assemblies to one another.

2. The semiconductor arrangement of claim 1, wherein:
   (a) each of the basic chip assemblies has an electrically conductive upper compensating die, which is arranged on the side of the upper main electrode facing away from the semiconductor body and which is connected with a material bonded connection and electrically conductively connected by means of an upper connecting layer to the upper main electrode; or
   (b) the basic chip assemblies have a common electrically conductive upper compensating plate, which for each of the basic chip assemblies is arranged on the side of the upper main electrode facing away from the semiconductor body and which is connected with a material bonded connection and electrically conductively connected by means of an upper connecting layer to the upper main electrode.

3. The semiconductor arrangement of claim 2, wherein the upper connecting layer is formed as a solder layer or as an adhesive layer, or as a layer of a sintered metal powder.

4. The semiconductor arrangement of claim 2, wherein:
   in case (a) the upper compensating dies respectively have a linear thermal expansion coefficient of less than 11 ppm/K; or
   in case (b) the upper compensating plate has a linear thermal expansion coefficient of less than 11 ppm/K.

5. The semiconductor arrangement of claim 2, wherein:
   in case (a) the upper compensating dies respectively have a thickness of at least 0.4 mm in the vertical direction; or
   in case (b) the upper compensating plate has a thickness of at least 0.4 mm in the vertical direction.

6. The semiconductor arrangement of claim 2, wherein the upper contact plate has a plane surface section on its side facing toward the lower contact plate, which:
   in case (a) electrically contacts the side, of the upper compensating die of each of the basic chip assemblies, facing away from the semiconductor body; or
   in case (b) electrically contacts the side of the upper compensating plate facing away from the semiconductor body.

7. The semiconductor arrangement of claim 2, wherein the upper contact plate, on its side facing toward the lower contact plate:
   in case has an upper contact elevation for each of the basic chip assemblies, which electrically contacts the side, of the upper compensating die of each of the basic chip assemblies, facing away from the semiconductor body; or
   in case (b), has an upper contact elevation for each of the basic chip assemblies, which electrically contacts the side of the upper compensating plate facing away from the semiconductor body.

8. The semiconductor arrangement of claim 1, wherein:
   (c) each of the basic chip assemblies has an electrically conductive lower compensating die, which is arranged on the side of the lower main electrode facing away from the semiconductor body and is connected with a material bonded connection and electrically conductively by means of a lower connecting layer to the lower main electrode; or
   (d) the basic chip assemblies have a common electrically conductive lower compensating plate, which for each of the basic chip assemblies is arranged on the side of the lower main electrode facing away from the semiconductor body and is connected with a material bonded connection and electrically conductively by means of a lower connecting layer to the lower main electrode.

9. The semiconductor arrangement of claim 8, wherein the lower connecting layer is formed as a solder layer or as an adhesive layer, or as a layer of a sintered metal powder.

10. The semiconductor arrangement of claim 8, wherein:
    in case (c) the lower compensating dies respectively have a linear thermal expansion coefficient of less than 11 ppm/K; or
    in case (d) the lower compensating plate has a linear thermal expansion coefficient of less than 11 ppm/K.

11. The semiconductor arrangement of claim 8, wherein:
    in case (c) the lower compensating dies respectively have a thickness of at least 0.4 mm in the vertical direction, or
    in case (d) the lower compensating plate has a thickness of at least 0.4 mm in the vertical direction.

12. The semiconductor arrangement of claim 8, wherein the lower contact plate has a plane surface section on its side facing toward the upper contact plate, which:
    in case (c) electrically contacts the side, of the lower compensating die of each of the basic chip assemblies, facing away from the semiconductor body; or
    in case (d) electrically contacts the side of the lower compensating plate facing away from the semiconductor body.

13. The semiconductor arrangement of claim 8, wherein the lower contact plate, on its side facing toward the upper contact plate:
    in case (c) has a lower contact elevation for each of the basic chip assemblies, which electrically contacts the side, of the lower compensating die of each of the basic chip assemblies, facing away from the semiconductor body; or
    in case (d) has a lower contact elevation for each of the basic chip assemblies, which electrically contacts the side of the lower compensating plate facing away from the semiconductor body.

14. The semiconductor arrangement of claim 1, further comprising a dielectric spacer ring arranged between the upper contact plate and the lower contact plate and surrounding the basic chip assemblies.

15. The semiconductor arrangement of claim 1, further comprising an electrically conductive connection piece, which:
    is embedded in the embedding compound;
    is electrically conductively connected to the control electrodes by the control electrode interconnection structure;
    is electrically contacted by a connection electrode which is passed through a feed-through formed in the embedding compound.

16. The semiconductor arrangement of claim 15, wherein the feed-through extends starting from a side edge of the solid assembly in a direction perpendicular to the vertical direction into the embedding compound, as far as the connection piece.

17. The semiconductor arrangement of claim 1, wherein the control electrode interconnection structure is formed as a printed circuit board, or as a structured metallization layer.

18. The semiconductor arrangement of claim 1, wherein the semiconductor body has a spacing of at least 300 μm to the immediately adjacent basic chip assemblies.

19. The semiconductor arrangement of claim 1, wherein the control electrode interconnection structure has a conformally deposited conductor structure.

20. The semiconductor arrangement of claim 19, wherein the conformally deposited conductor structure has a thickness in the range of from 30 μm to 70 μm.

21. A method for operating a semiconductor arrangement, the method comprising:
  forming a semiconductor arrangement that comprises:
    an upper contact plate and a lower contact plate;
    a number of basic chip assemblies, each of which has:
      a semiconductor chip having a semiconductor body, the semiconductor body having an upper side and a lower side opposite the upper side, and the upper side being separated from the lower side in a vertical direction;
      an individual upper main electrode arranged on the upper side; and
      an individual control electrode arranged on the upper side;
    wherein the basic chip assemblies have either respectively a separate lower main electrode, which is arranged on the lower side of the semiconductor chip of the relevant basic chip assembly, or a common lower main electrode, which for each of the basic chip assemblies is arranged on the lower side of the semiconductor body of that basic chip assembly;
    wherein, for each of the basic chip assemblies, an electrical current between the individual upper main electrode and the individual or common lower main electrode is controllable by means of its control electrode;
    a dielectric embedding compound, by which the basic chip assemblies are connected to one another with a material bonded connection so as to form a solid assembly;
    a control electrode interconnection structure, which is embedded in the solid assembly and which electrically conductively connects the control electrodes of the basic chip assemblies to one another;
  providing an electrically conductive upper pressure contact piece and an electrically conductive lower pressure contact piece;
  clamping the semiconductor arrangement between the upper pressure contact piece and the lower pressure contact piece, such that there is a pure pressure contact between the upper pressure contact piece and the upper contact plate and there is a pure pressure contact between the lower pressure contact piece and the lower contact plate; and
  connecting the upper pressure contact piece and the lower pressure contact piece to an electrical voltage source, so that different electrical potentials are applied to the upper pressure contact piece and the lower pressure contact piece.

* * * * *

UNITED STATES PATENT AND TRADEMARK OFFICE
CERTIFICATE OF CORRECTION

PATENT NO. : 9,620,459 B2  
APPLICATION NO. : 14/476241  
DATED : April 11, 2017  
INVENTOR(S) : G. Beer et al.

Page 1 of 1

It is certified that error appears in the above-identified patent and that said Letters Patent is hereby corrected as shown below:

In the Claims

Column 23, Line 54 (Claim 7, Line 4) please change "in case has" to -- in case (a), has --

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*